(12) United States Patent
Sakamoto

(10) Patent No.: US 12,042,882 B2
(45) Date of Patent: *Jul. 23, 2024

(54) WORKPIECE CUTTING METHOD

(71) Applicant: HAMAMATSU PHOTONICS K.K., Hamamatsu (JP)

(72) Inventor: Takeshi Sakamoto, Hamamatsu (JP)

(73) Assignee: HAMAMATSU PHOTONICS K.K., Hamamatsu (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/605,285

(22) PCT Filed: Apr. 12, 2018

(86) PCT No.: PCT/JP2018/015410
§ 371 (c)(1),
(2) Date: Oct. 15, 2019

(87) PCT Pub. No.: WO2018/193966
PCT Pub. Date: Oct. 25, 2018

(65) Prior Publication Data
US 2020/0122275 A1  Apr. 23, 2020

(30) Foreign Application Priority Data

Apr. 17, 2017  (JP) .................................. 2017-081530

(51) Int. Cl.
*B23K 26/53* (2014.01)
*B23K 26/362* (2014.01)
(Continued)

(52) U.S. Cl.
CPC ............ *B23K 26/53* (2015.10); *B23K 26/362* (2013.01); *B23K 26/38* (2013.01); *B23K 26/40* (2013.01);
(Continued)

(58) Field of Classification Search
CPC ...... B23K 26/53; B23K 26/60; B23K 26/364; B23K 2103/50; B23K 2103/56;
(Continued)

(56) References Cited

U.S. PATENT DOCUMENTS 11,270,915 B2 *  3/2022  Sakamoto .......... B23K 26/0853
2006/0166465 A1 *  7/2006  Ono .......................... H01L 21/78
438/460

(Continued)

FOREIGN PATENT DOCUMENTS

CN       102623373 A    8/2012
JP    2006-140355 A    6/2006
(Continued)

OTHER PUBLICATIONS

English translation of JP 2012-023085 (Arai) (Year: 2012).*
International Preliminary Report on Patentability mailed Oct. 31, 2019 for PCT/JP2018/015410.

*Primary Examiner* — Elizabeth M Kerr
(74) *Attorney, Agent, or Firm* — Faegre Drinker Biddle & Reath LLP

(57) ABSTRACT

An object cutting method includes: a first step of preparing an object to be processed including a single crystal silicon substrate and a functional device layer provided on a first main surface side; a second step of irradiating the object with laser light to form at least one row of modified regions in the single crystal silicon substrate and to form a fracture in the object so as to extend between the at least one row of modified regions and a second main surface of the object; a third step of forming an etching protection layer having a gas passing region formed, on the second main surface; and a fourth step of performing dry etching on the object from the second main surface side, in a state in which the etching (Continued)

protection layer is formed on the second main surface, to form a groove opening to the second main surface.

9 Claims, 40 Drawing Sheets

(51) Int. Cl.
    *B23K 26/38*     (2014.01)
    *B23K 26/40*     (2014.01)
    *B23K 101/40*     (2006.01)
    *B23K 103/00*     (2006.01)
    *C03C 23/00*     (2006.01)
    *H01L 21/3065*     (2006.01)

(52) U.S. Cl.
    CPC ...... *C03C 23/0025* (2013.01); *H01L 21/3065* (2013.01); *B23K 2101/40* (2018.08); *B23K 2103/50* (2018.08)

(58) Field of Classification Search
    CPC .......... H01L 21/3065; H01L 21/30655; H01L 21/30621; H01L 2221/68336
    See application file for complete search history.

(56) References Cited

U.S. PATENT DOCUMENTS

2010/0136766 A1* 6/2010 Sakamoto ............ B23K 26/53
    257/E21.599
2012/0125893 A1* 5/2012 Shimoi ............. H01L 23/49827
    216/87
2012/0322233 A1* 12/2012 Lei ....................... B23K 26/364
    257/E21.602
2013/0059428 A1 3/2013 Arai
2015/0214101 A1* 7/2015 Ren ................... H01L 21/31116
    438/724
2018/0022634 A1* 1/2018 Inoue .................. B23K 26/352
    216/55

FOREIGN PATENT DOCUMENTS

| | | | |
|---|---|---|---|
| JP | 2006-210401 A | 8/2006 | |
| JP | 2007-069216 A | 3/2007 | |
| JP | 2009-39755 A | 2/2009 | |
| JP | 2009039755 A * | 2/2009 | |
| JP | 4781661 B2 * | 9/2011 | ............ B23K 26/38 |
| JP | 2012-023085 A | 2/2012 | |
| JP | 2012-28645 A | 2/2012 | |
| JP | 2012023085 A * | 2/2012 | |
| JP | 2012028645 A * | 2/2012 | .......... B23K 26/382 |
| JP | 2013-55120 A | 3/2013 | |
| JP | 2014-019610 A | 2/2014 | |
| JP | 2016-210401 A | 12/2016 | |
| TW | I501830 B | 10/2015 | |
| WO | WO-2008/146744 A1 | 12/2008 | |

* cited by examiner

*Fig.7*
(a)
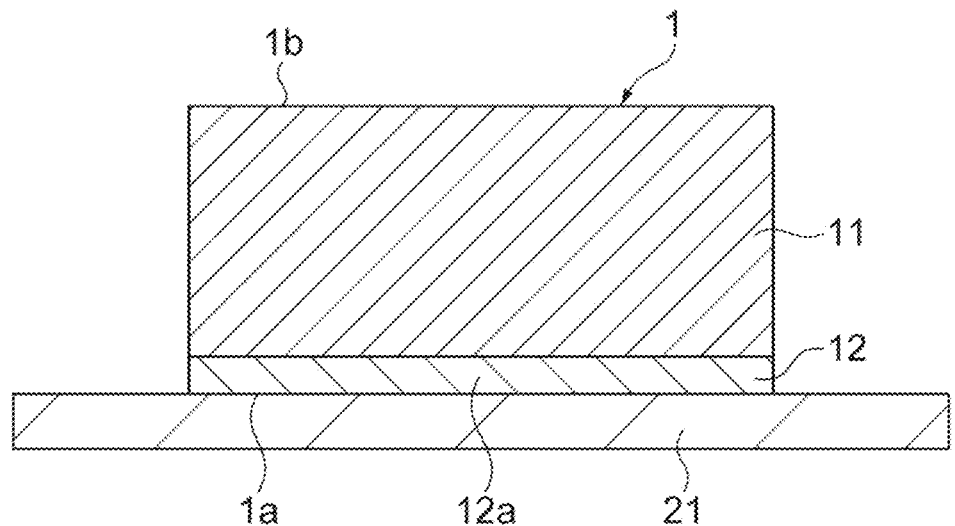
(b)
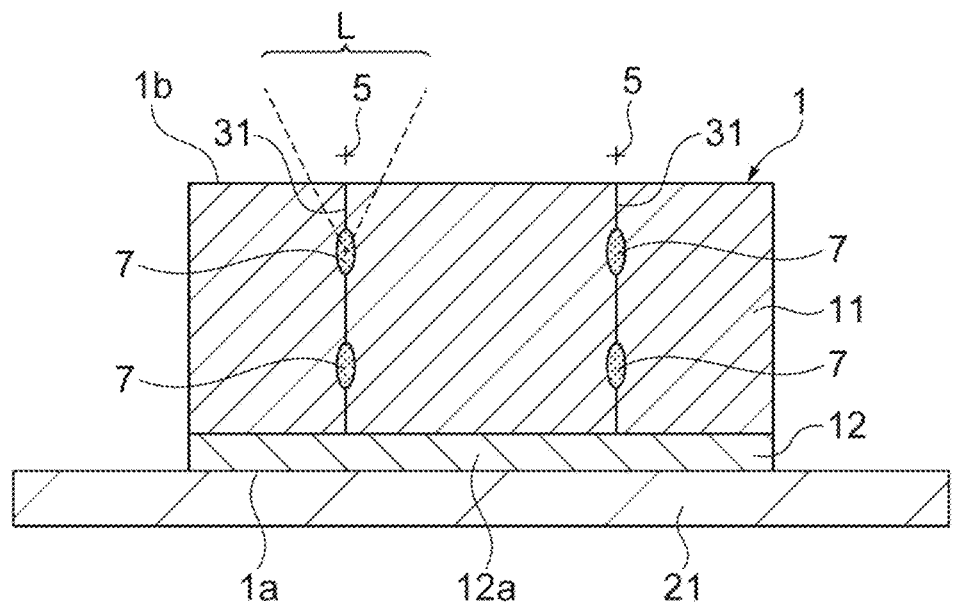

*Fig.8*
(a)
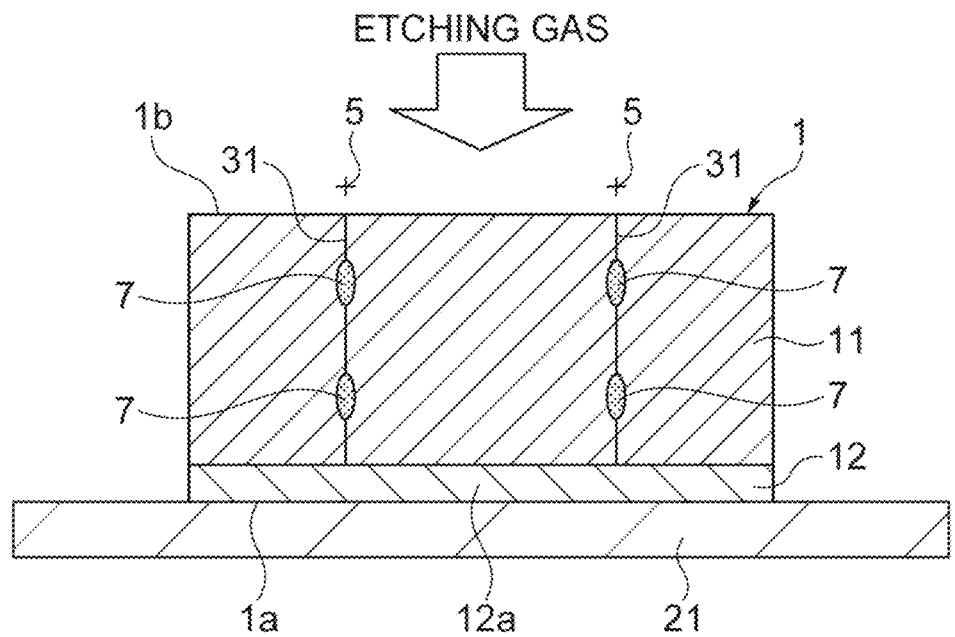
(b)
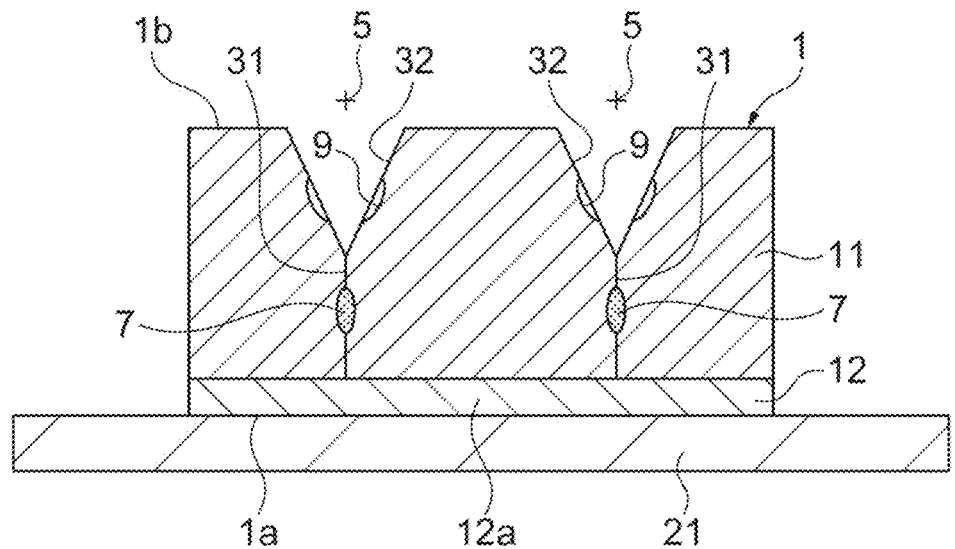

*Fig.9*
(a)
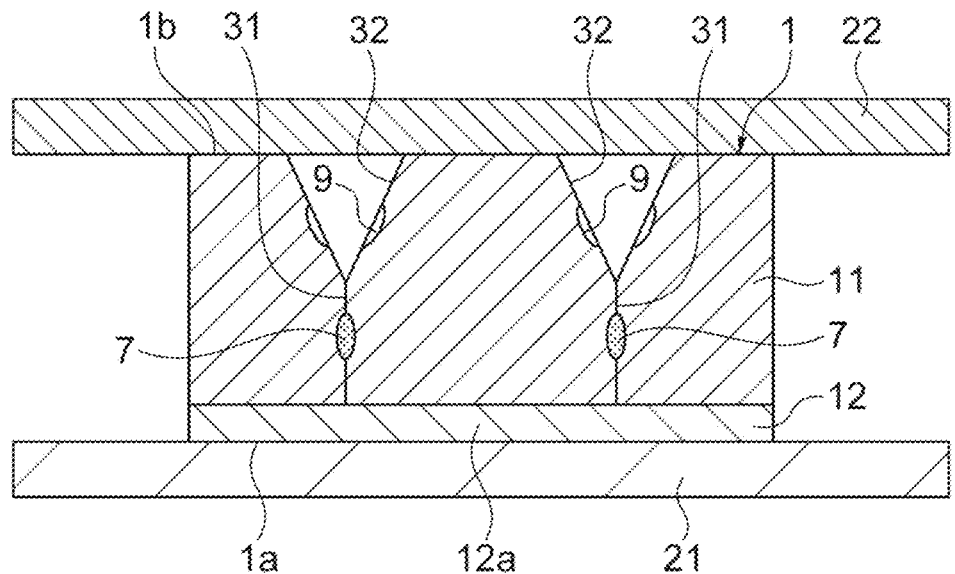
(b)
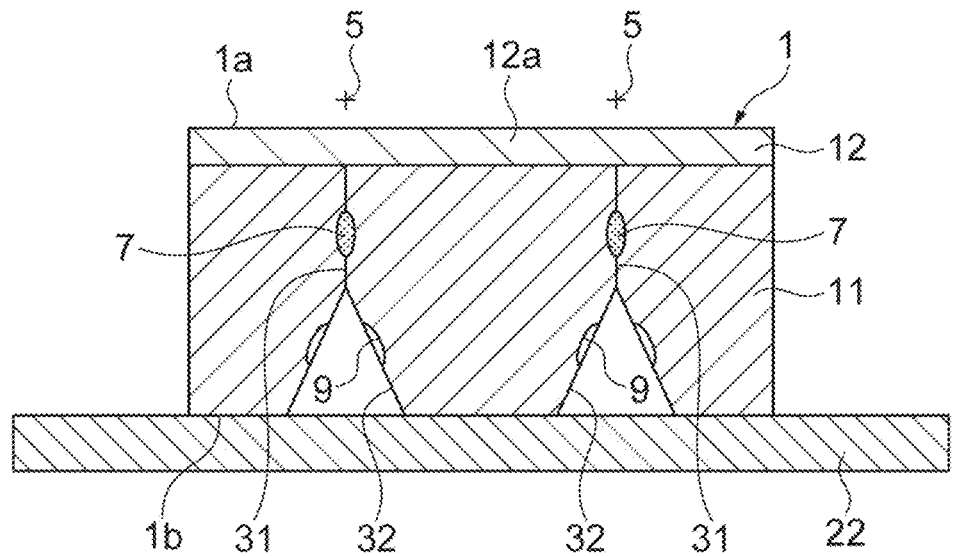

*Fig.10*
(a)
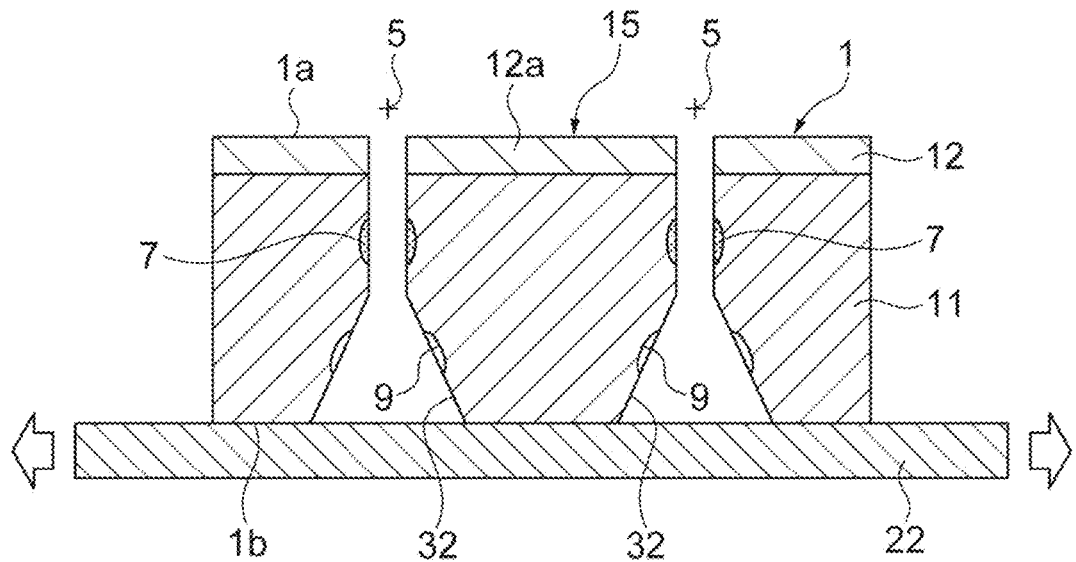
(b)
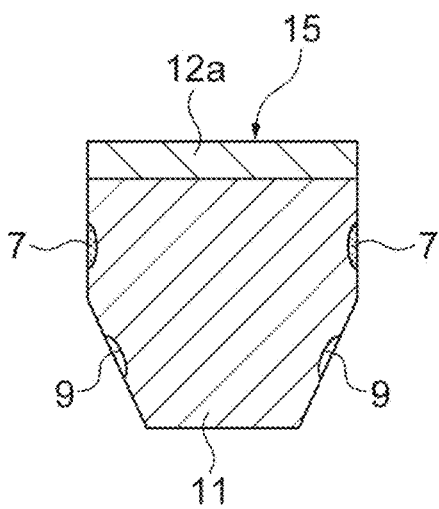

Fig. 12

| | STANDARD PROCESSING SURFACE : HC | TACT-UP PROCESSING SURFACE : HC | VL PATTERN PROCESSING SURFACE : HC | VL PATTERN PROCESSING SURFACE : ST | VL PATTERN PROCESSING SURFACE : ABLATION |
|---|---|---|---|---|---|
| GROOVE WIDTH (μm) | 19 | 18.5 | 17.5 | 0.5 | 0.5 |
| GROOVE DEPTH (μm) | 80 | 44 | 68 | 0 | 0 |
| GROOVE ASPECT RATIO | 4.2 | 2.4 | 3.9 | - | - |
| Si ETCHING AMOUNT (μm) | 16 | 16 | 16 | 16 | 16 |
| SD ETCHING AMOUNT (μm) | 96 | 60 | 84 | - | - |
| ETCHING TIME (min) | 60 | 60 | 60 | 60 | 60 |
| Si ETCHING RATE (μm/min) | 0.27 | 0.27 | 0.27 | 0.27 | 0.27 |
| SD ETCHING RATE (μm/min) | 1.6 | 1.0 | 1.4 | - | - |
| ETCHING RATE RATIO | 5.9 | 3.7 | 5.2 | - | - |
| (a) | | | | | |
| (b) | | | | | |

*Fig.15*

| | CF₄ : 60min | CF₄ : 120min |
|---|---|---|
| (a) | | |
| (b) | 100 μm (top), 88 μm (bottom), 40 μm, 92 μm<br>Si ETCHING RATE (μm/min) : 0.13<br>SD ETCHING RATE (μm/min) : 0.8<br>ETCHING RATE RATIO : 6.1 | 100 μm (top), 79 μm (bottom), 80 μm<br>Si ETCHING RATE (μm/min) : 0.16<br>SD ETCHING RATE (μm/min) : 0.83<br>ETCHING RATE RATIO : 5.2 |

Fig. 16
| | CF₄(RIE) | SF₆(RIE) | SF₆(DRIE) |
|---|---|---|---|
| GROOVE WIDTH (μm) | 20 | 12 | 14 |
| GROOVE DEPTH (μm) | 85 | 12 | 13 |
| GROOVE ASPECT RATIO | 4.25 | 1.00 | 0.93 |
| Si ETCHING AMOUNT (μm) | 25.00 | 23.00 | 24.00 |
| SD ETCHING AMOUNT (μm) | 110.00 | 35.00 | 37.00 |
| ETCHING TIME (min) | 240.00 | 100.00 | 11.00 |
| Si ETCHING RATE (μm/min) | 0.10 | 0.23 | 2.18 |
| SD ETCHING RATE (μm/min) | 0.46 | 0.35 | 3.36 |
| ETCHING RATE RATIO | 4.40 | 1.52 | 1.54 |
| (a) | 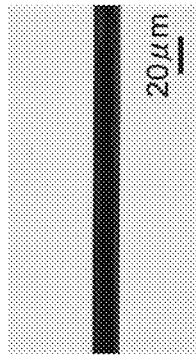 | 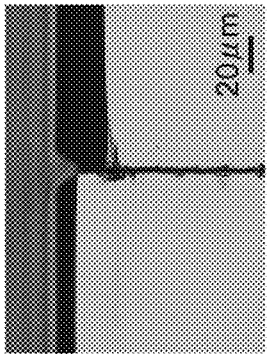 | 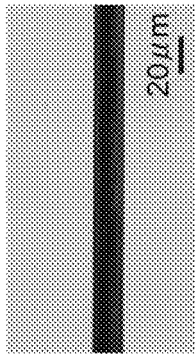 |
| (b) | 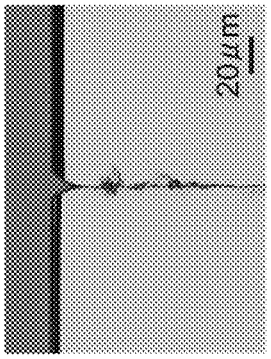 | | |

| | CF₄(RIE): 30min SURFACE: HC | CF₄(RIE): 60min SURFACE: HC | CF₄(RIE): 6H SURFACE: HC | CF₄(RIE): 6H SURFACE: ST |
|---|---|---|---|---|
| GROOVE WIDTH (μm) | 9 | 19 | 140 | 88 |
| GROOVE DEPTH (μm) | 30 | 80 | 256~290 | 186~212 |
| GROOVE ASPECT RATIO | 3.33 | 4.21 | 2.07 | 2.41 |
| Si ETCHING AMOUNT (μm) | 7 | 16 | 110 | 110 |
| SD ETCHING AMOUNT (μm) | 37 | 96 | 400 | 322 |
| ETCHING TIME (min) | 30.00 | 60.00 | 360.00 | 360.00 |
| Si ETCHING RATE (μm/min) | 0.23 | 0.27 | 0.31 | 0.31 |
| SD ETCHING RATE (μm/min) | 1.23 | 1.60 | 1.11 | 0.89 |
| ETCHING RATE RATIO | 5.29 | 6.00 | 3.64 | 2.93 |

(a)

Fig. 18
| | CF4(RIE) SURFACE : HC | XeF2 SURFACE : HC | XeF2 SURFACE : HC SiO2 ETCHING PROTECTION FILM |
|---|---|---|---|
| GROOVE WIDTH (μm) | 20 | 13~23 | 241~280 |
| GROOVE DEPTH (μm) | 85 | 75 | 306 OR MORE (REMOVAL WIDTH 40μm) |
| GROOVE ASPECT RATIO | 4.25 | 3.26 | 1.09 |
| Si ETCHING AMOUNT (μm) | 25.00 | 17.00 | 14.00 |
| SD ETCHING AMOUNT (μm) | 110.00 | 92.00 | 320.00 |
| ETCHING TIME (min) | 240.00 | 180 | 180 |
| Si ETCHING RATE (μm/min) | 0.10 | 0.09 | 0.08 |
| SD ETCHING RATE (μm/min) | 0.46 | 0.51 | 1.78 |
| ETCHING RATE RATIO | 4.40 | 5.41 | 22.86 |
| (a) | | 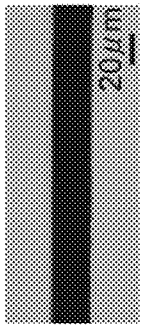 |  |
| (b) | 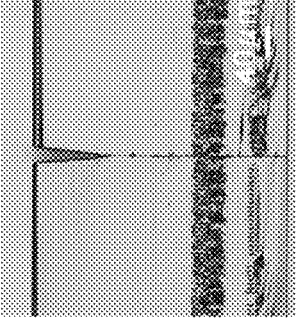 | 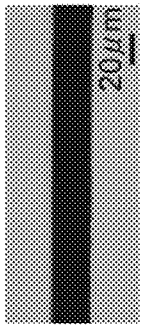 | 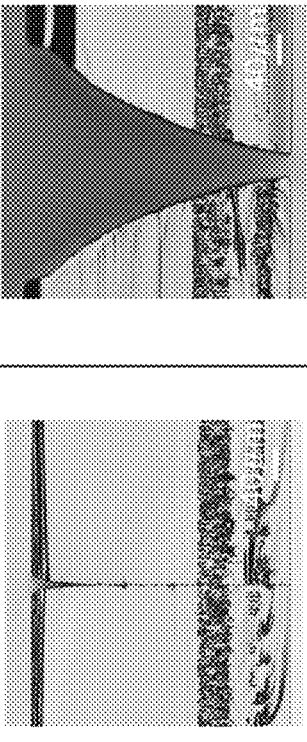 |
| (c) | | | 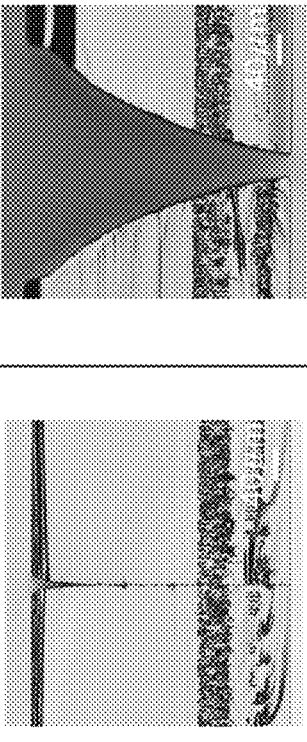 |

*Fig.19*

| | STANDARD PROCESSING SURFACE : HC | STANDARD PROCESSING SURFACE : ST | TACT-UP PROCESSING 1 SURFACE : HC | TACT-UP PROCESSING 2 SURFACE : HC | VI. PATTERN PROCESSING SURFACE : HC | VI. PATTERN PROCESSING SURFACE : ABLATION |
|---|---|---|---|---|---|---|
| GROOVE WIDTH (μm) | 241~280 | 0 | 196~228 | 166~205 | 134~195 | 97~453 |
| GROOVE DEPTH (μm) | 306 OR MORE (REMOVAL WIDTH 40μm) | 0 | 306 OR MORE (REMOVAL WIDTH 18μm) | 306 OR MORE (REMOVAL WIDTH 7μm) | 141 | 242 |
| GROOVE ASPECT RATIO | 1.09 | - | 1.34 | 1.49 | 0.72 | 0.53 |
| Si ETCHING AMOUNT (μm) | 14.00 | 14.00 | 14.00 | 14.00 | 14.00 | 14.00 |
| SiO ETCHING AMOUNT (μm) | 320.00 | 0.00 | 320.00 | 320.00 | 155.00 | 256.00 |
| ETCHING TIME (min) | 180 | 180 | 180 | 180 | 180 | 180 |
| Si ETCHING RATE (μm/min) | 0.08 | - | 0.08 | 0.08 | 0.08 | 0.08 |
| SiO ETCHING RATE (μm/min) | 1.78 | - | 1.78 | 1.78 | 0.86 | 1.42 |
| ETCHING RATE RATIO | 22.86 | - | 22.86 | 22.86 | 11.07 | 18.29 |
| (a) | | | | | | |
| (b) | | | | | | |

*Fig.22*
(a)
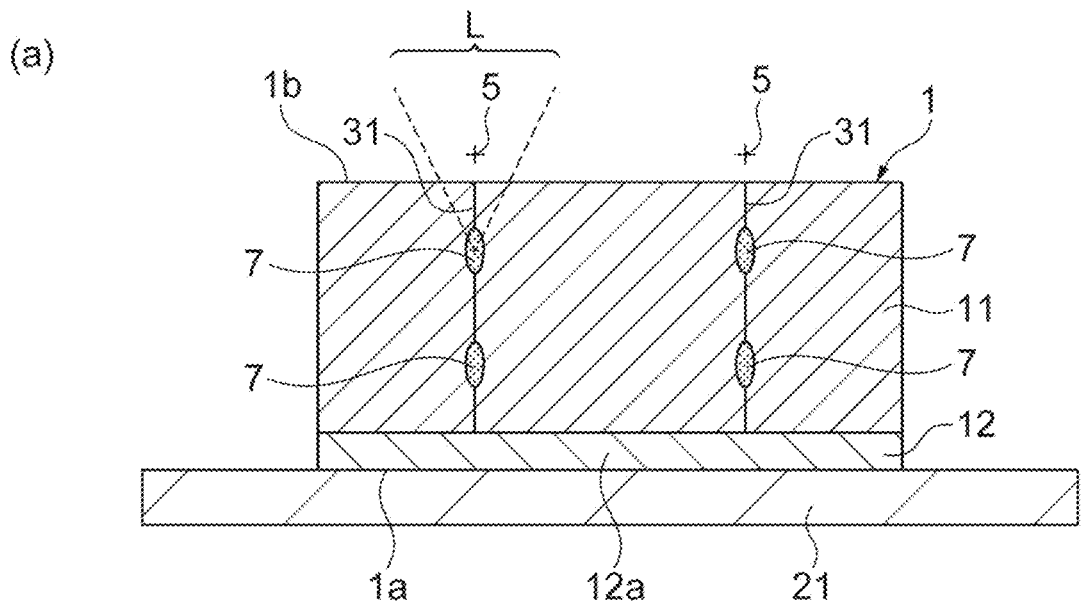
(b)
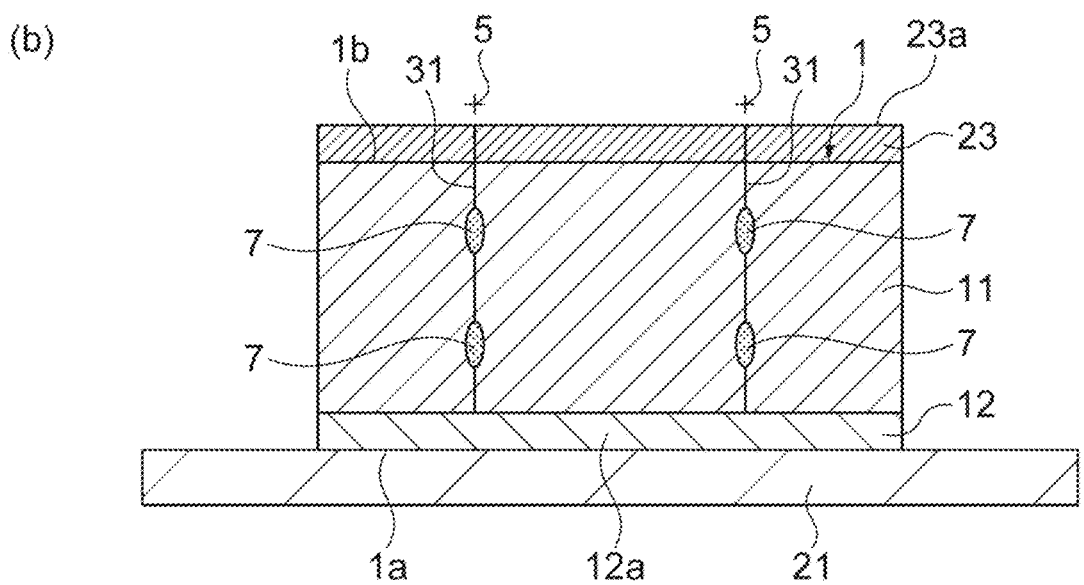

*Fig.23*
(a)
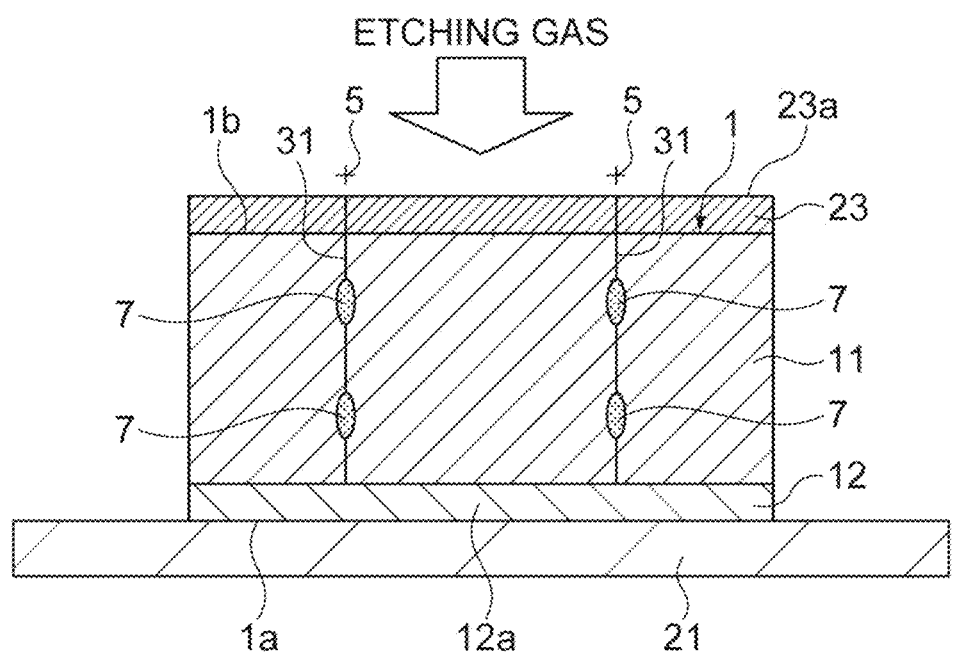
(b)
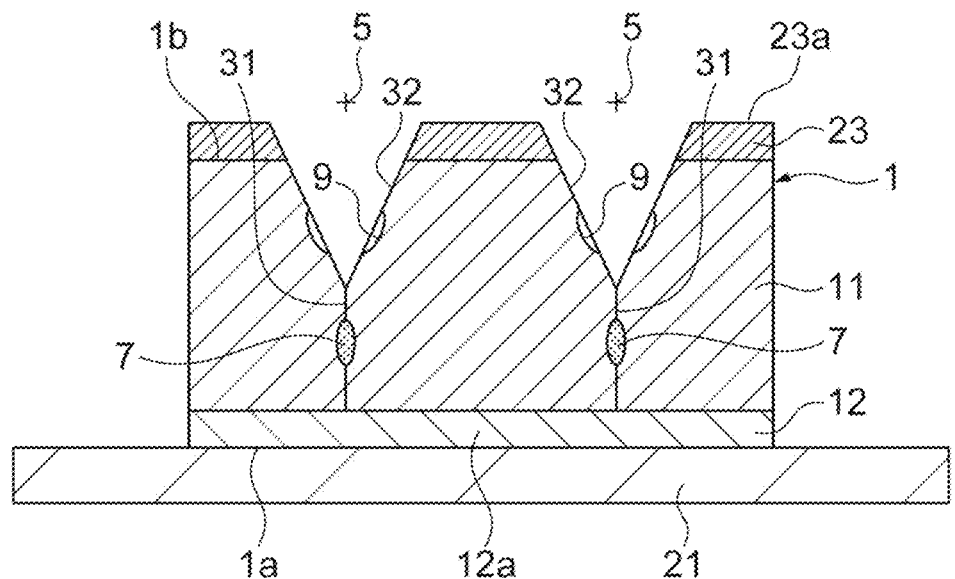

Fig.24
(a)
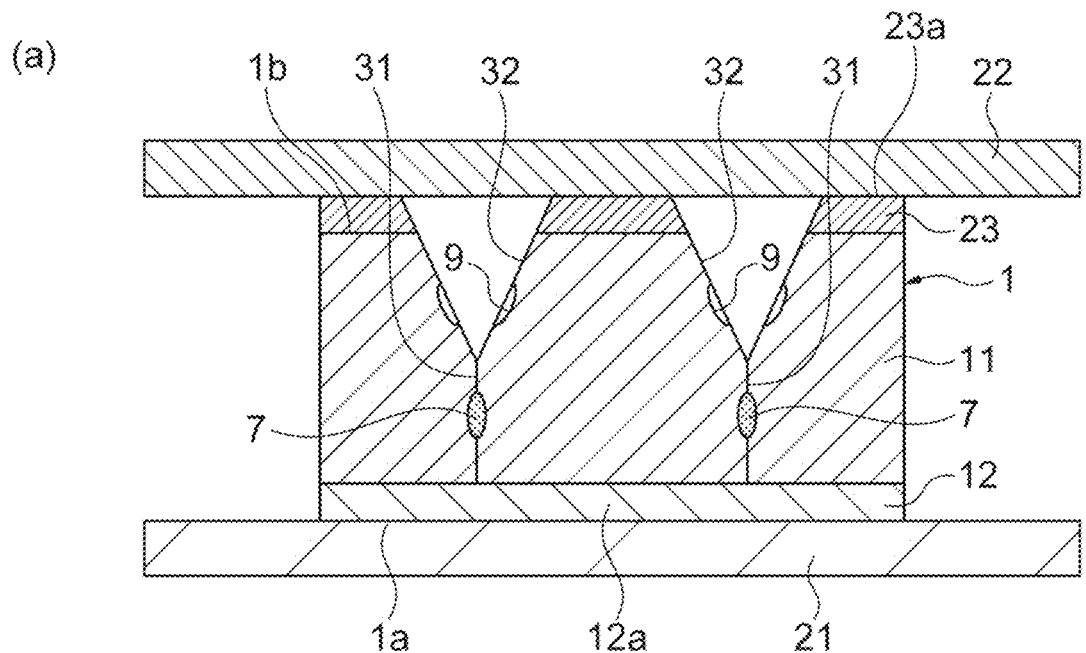
(b)
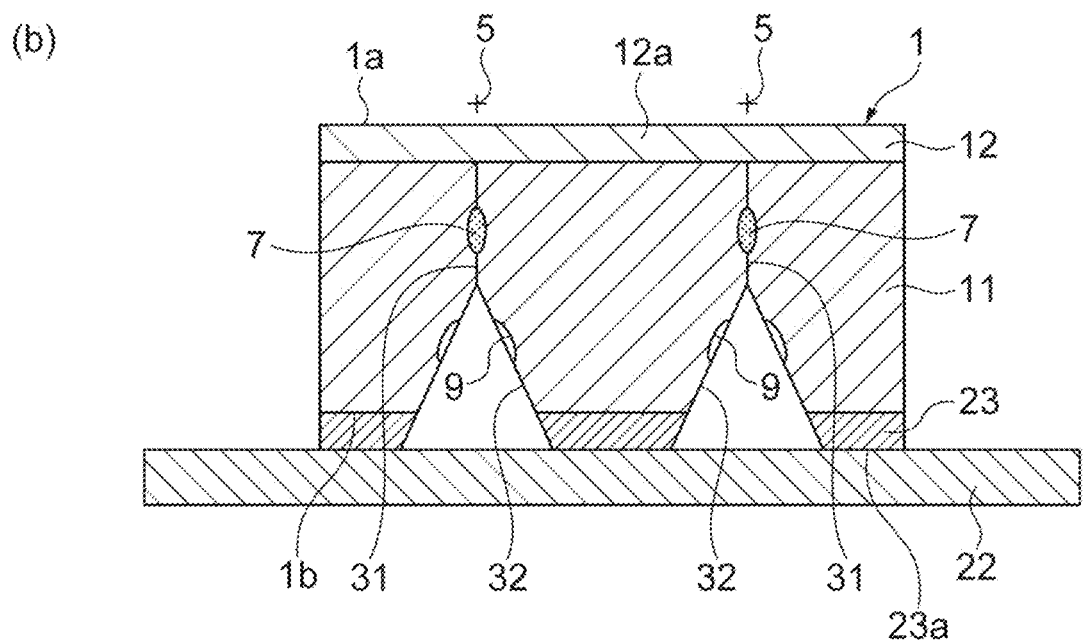

*Fig.25*
(a)
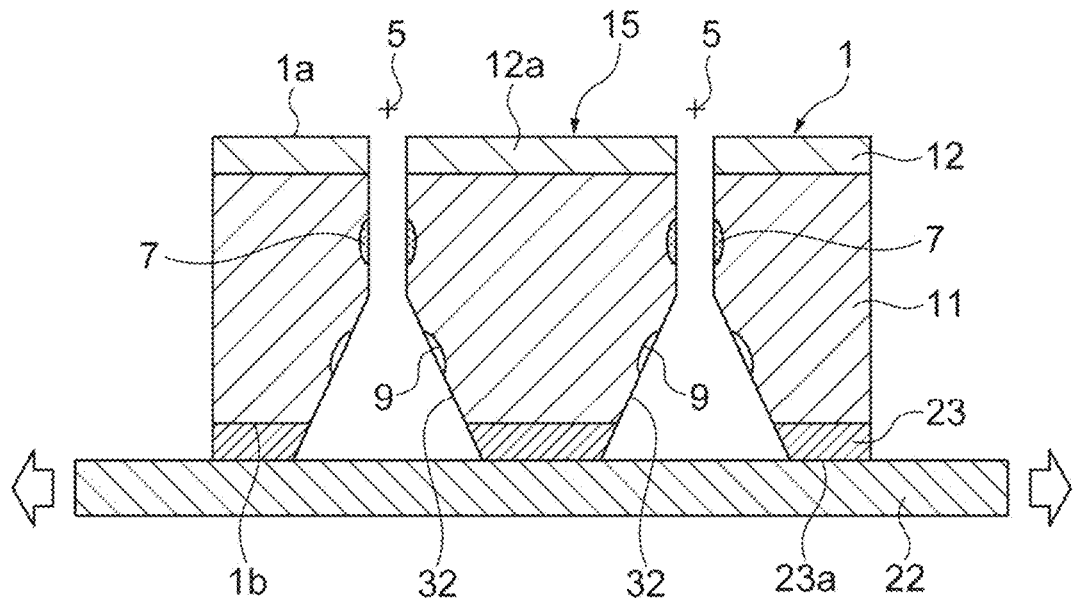
(b)
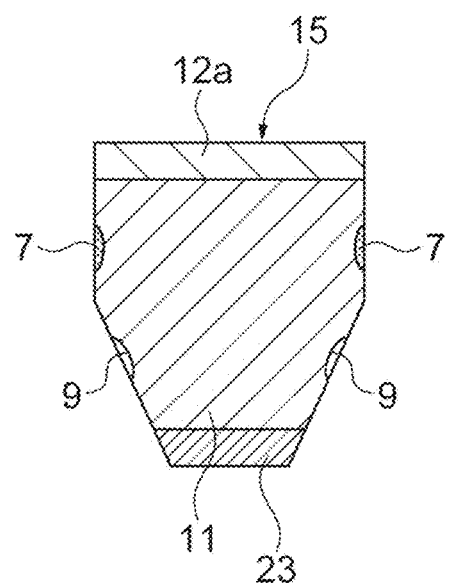

Fig.28
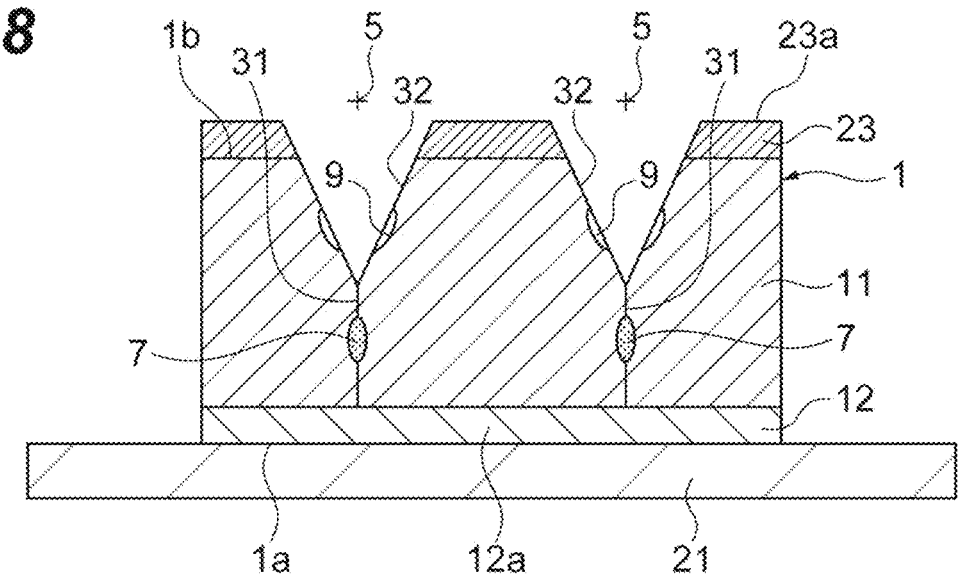
(a)
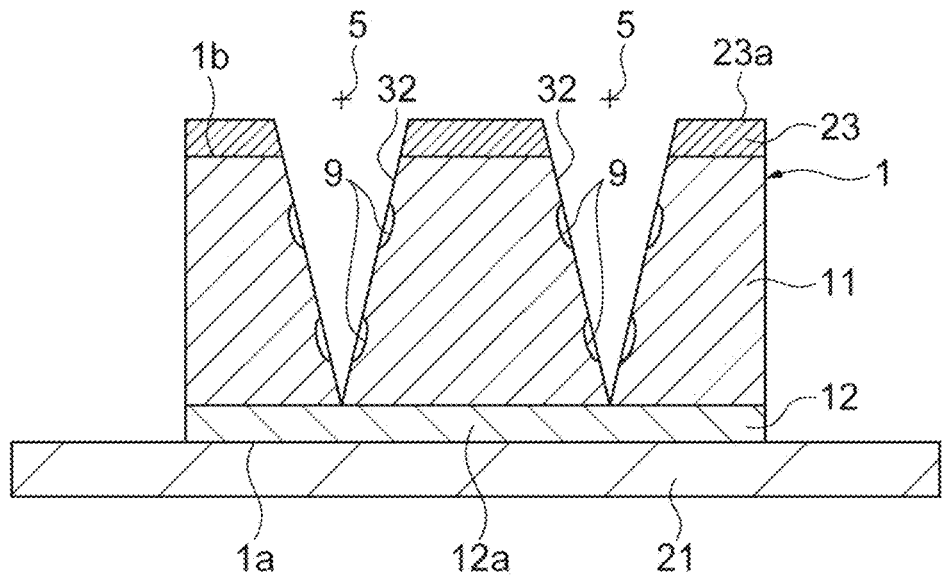
(b)
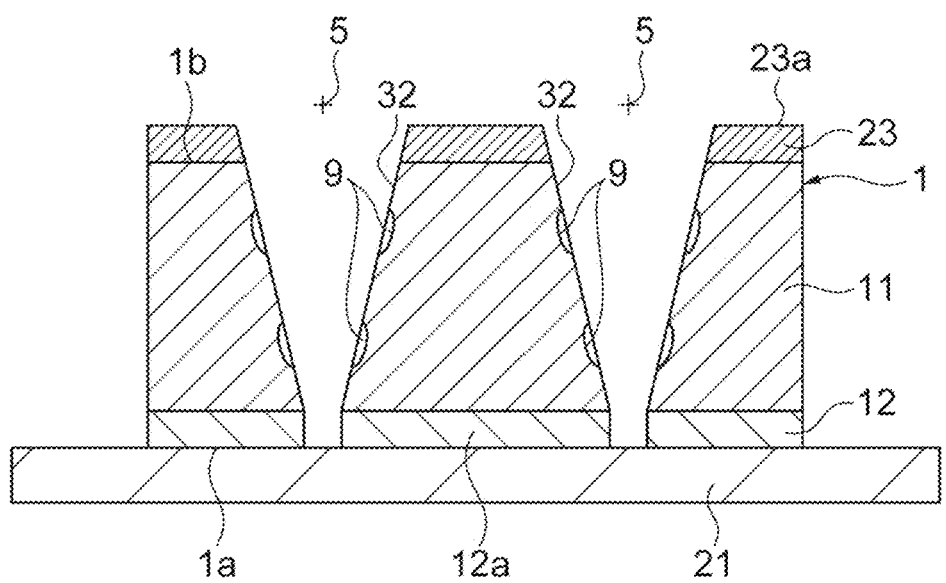
(c)

Fig.30
(a)
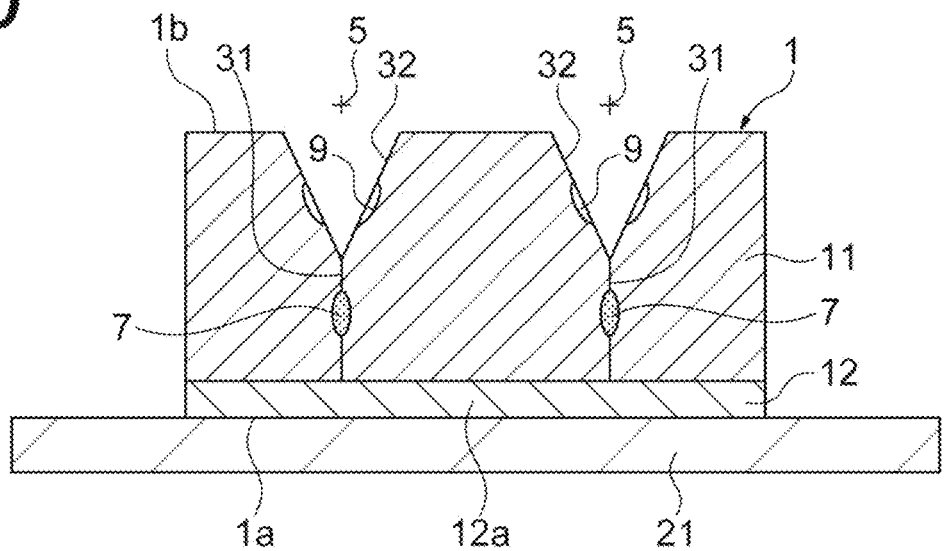
(b)
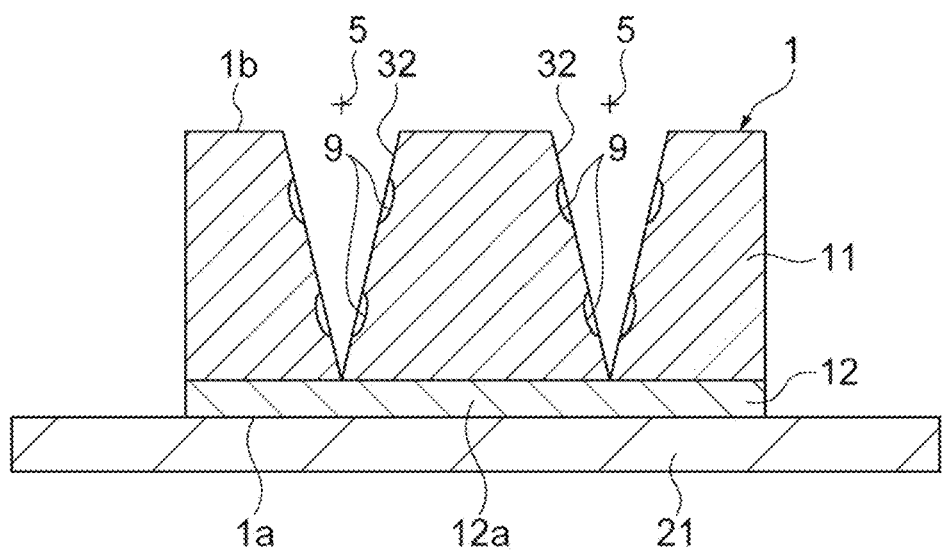
(c)
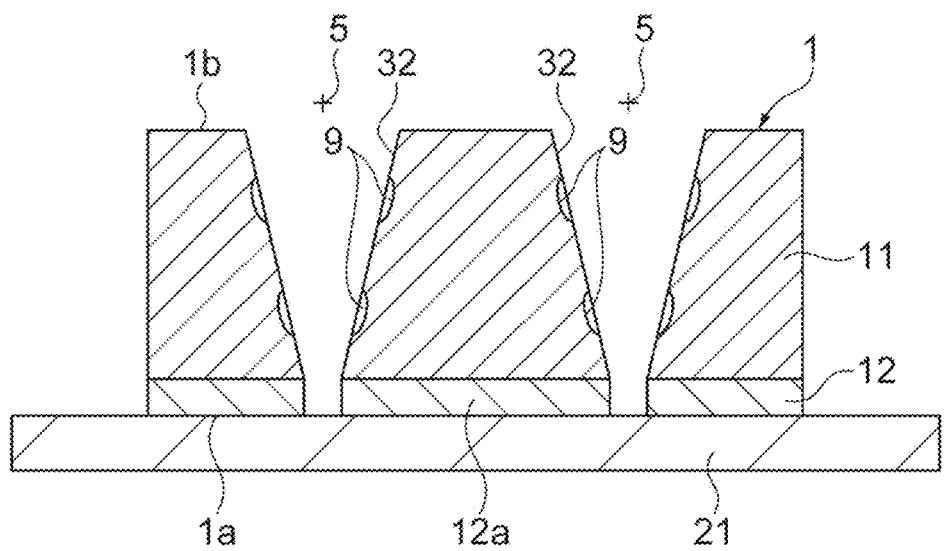

Fig.33
(a)
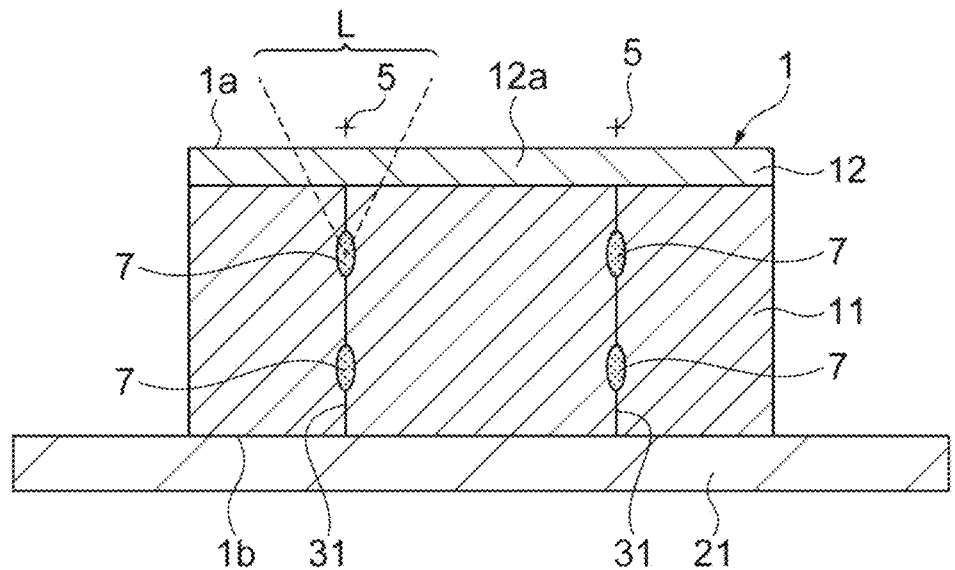
(b)
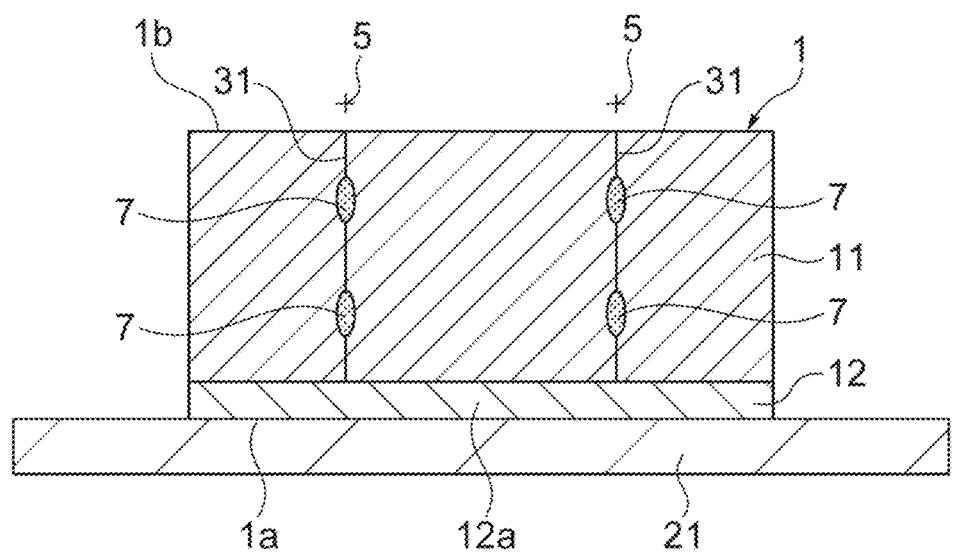

Fig.35
(a)
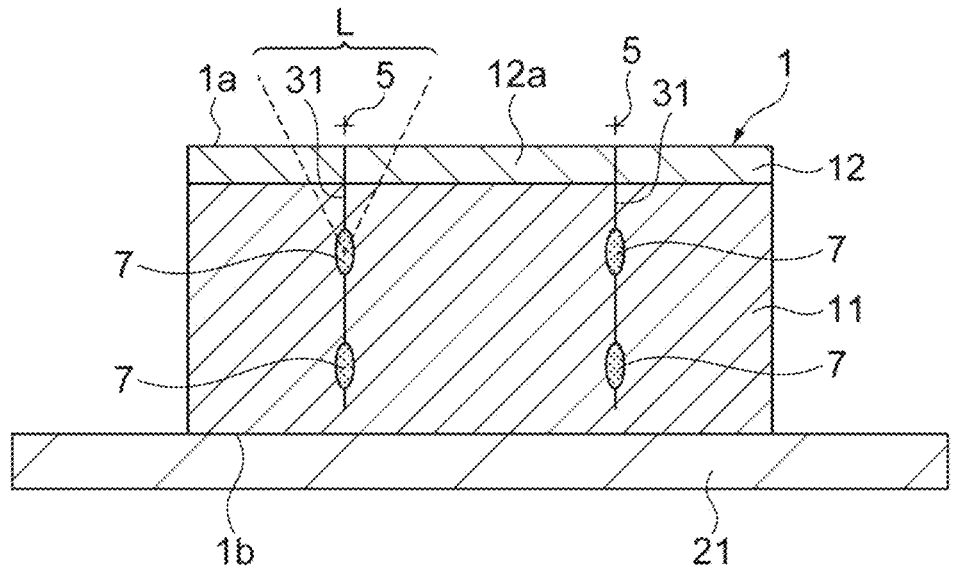
(b)
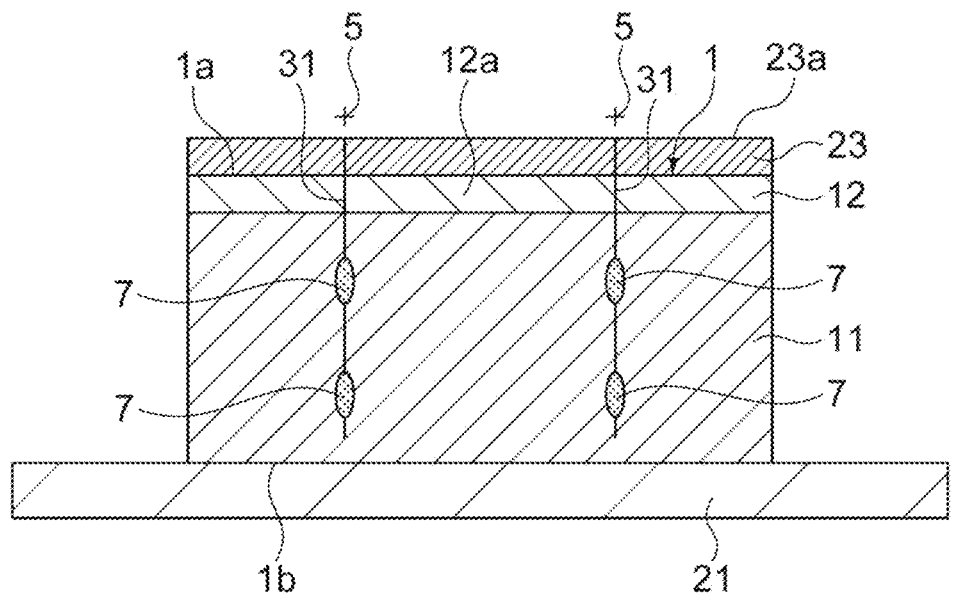

Fig.36
(a)
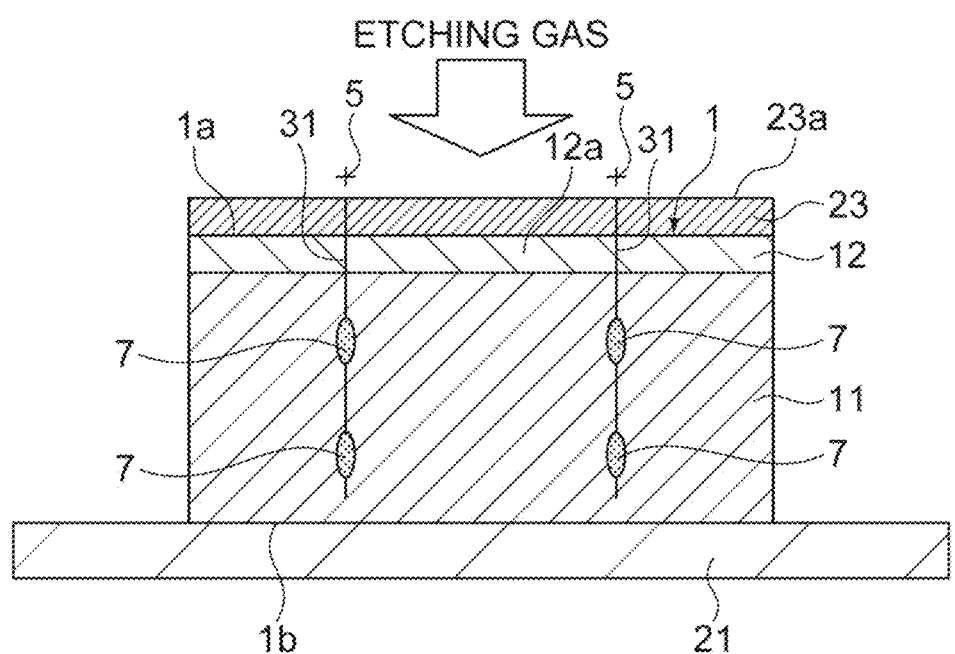
(b)
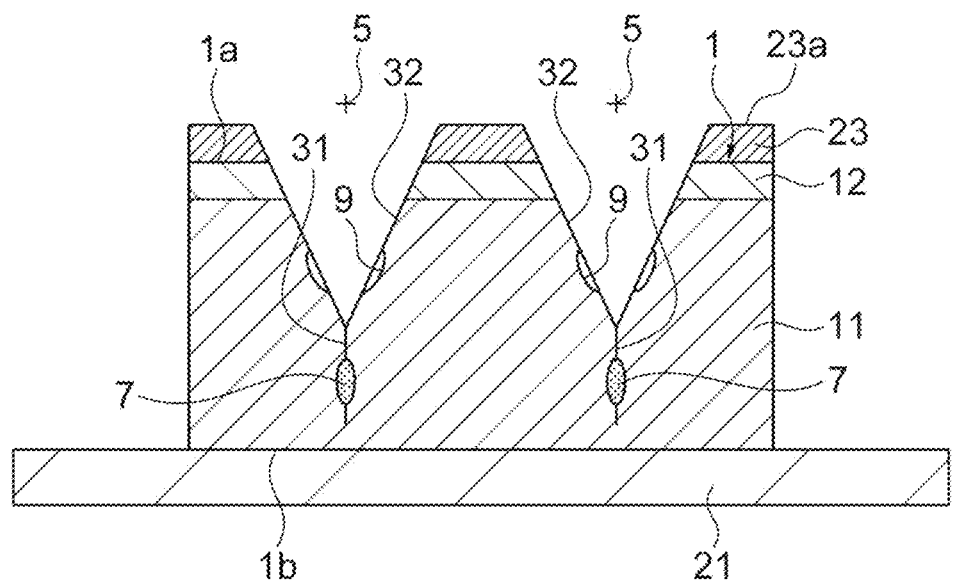

Fig.37
(a)
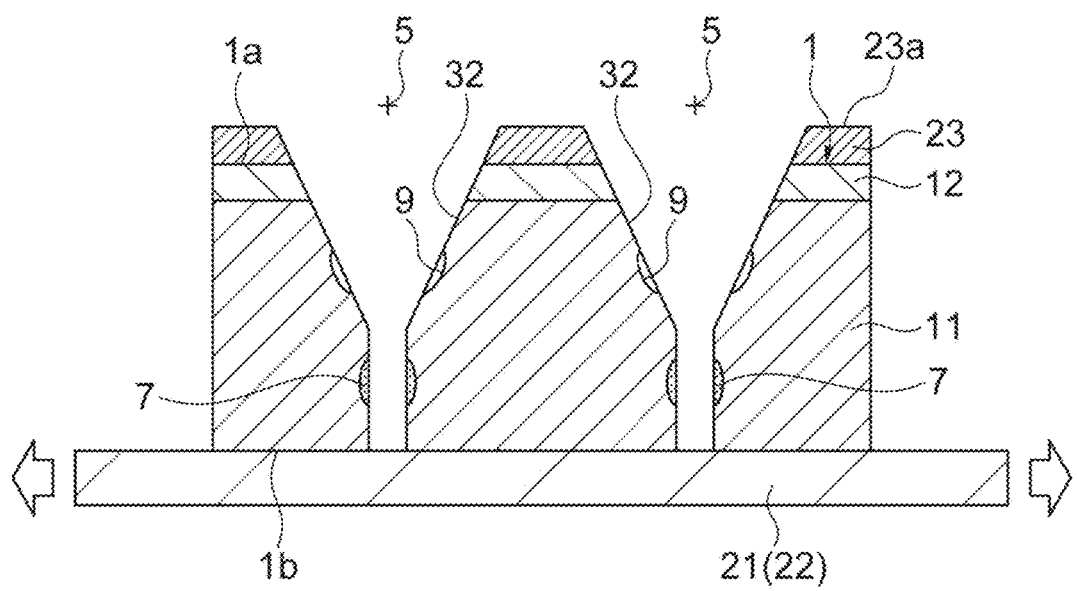
(b)
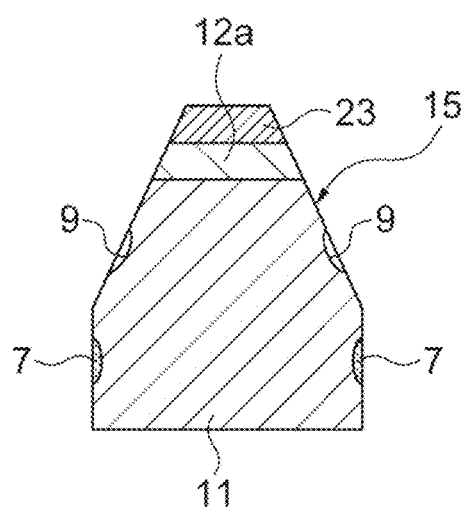

Fig.38
(a)
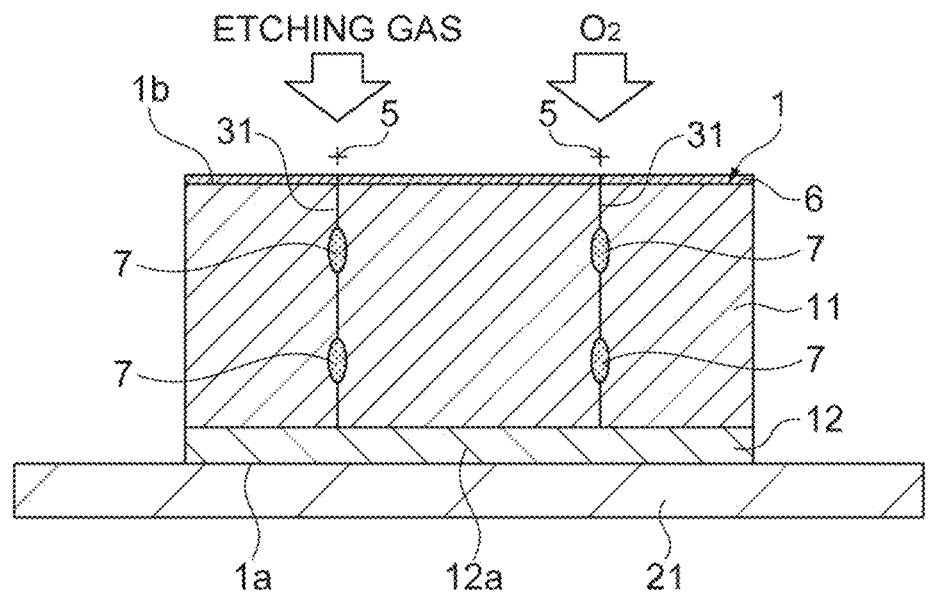
(b)
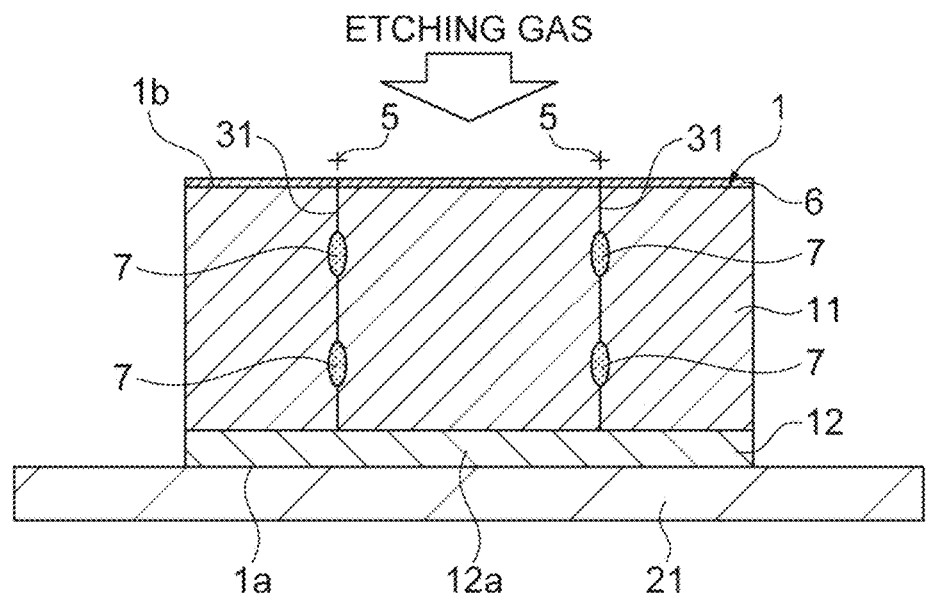
(c)
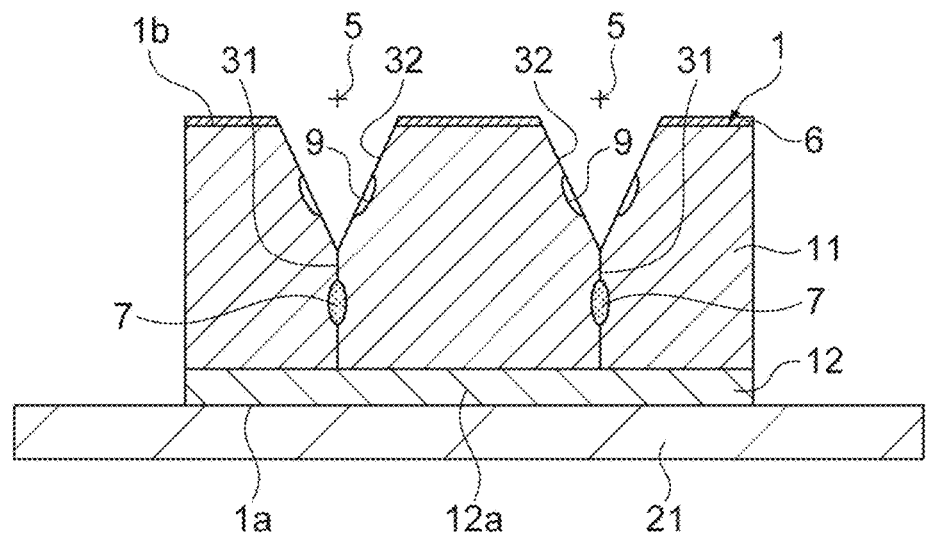

Fig.39
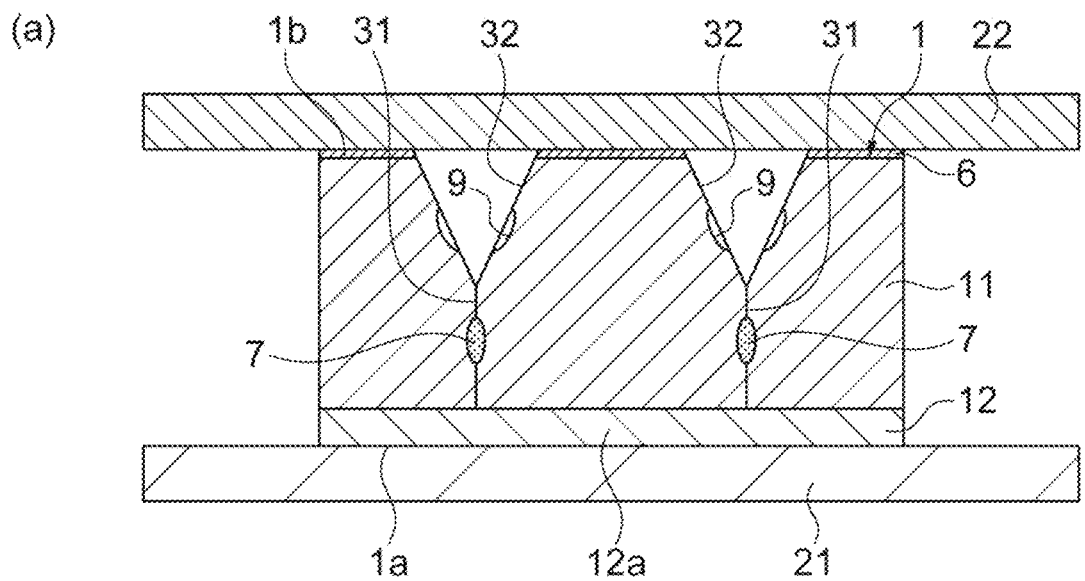
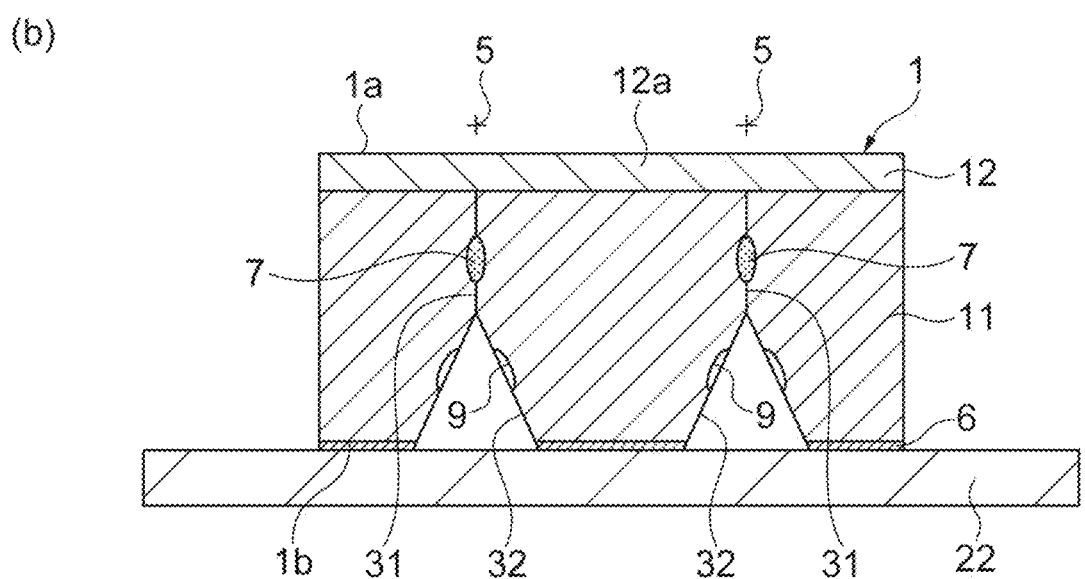

WORKPIECE CUTTING METHOD

TECHNICAL FIELD

The present disclosure relates to an object cutting method.

BACKGROUND ART

An object cutting method of cutting an object to be processed into a plurality of semiconductor chips along each of a plurality of lines to cut in a manner that at least one row of modified regions is formed in the object along each of the plurality of lines to cut, by irradiating the object with laser light, and then an extension film stuck to the object is extended is known (for example, see Patent Literature 1).

CITATION LIST

Patent Literature

Patent Literature 1: Japanese Patent No. 478661

SUMMARY OF INVENTION

Technical Problem

In the object cutting method as described above, the object is cut into the plurality of semiconductor chips in a manner that extension film is extended, and thus fractures extended from the modified region are caused to reach both main surfaces of the object, in some cases. However, a portion of the object, which is not cut into the plurality of semiconductor chips, may remain.

An object of the present disclosure is to provide an object cutting method in which it is possible to reliably cut an object to be processed into a plurality of semiconductor chips.

Solution to Problem

An object cutting method according to an aspect of the present disclosure includes: a first step of preparing an object to be processed including a single crystal silicon substrate and a functional device layer provided on a first main surface side; a second step of, after the first step, irradiating the object with laser light to form at least one row of modified regions in the single crystal silicon substrate along each of a plurality of lines to cut and to form a fracture in the object so as to extend between the at least one row of modified regions and a second main surface of the object along each of the plurality of lines to cut; a third step of, after the second step, forming an etching protection layer having a gas passing region formed along each of the plurality of lines to cut, on the second main surface; and a fourth step of, after the third step, performing dry etching on the object from a second main surface side, in a state in which the etching protection layer is formed on the second main surface, to foam a groove opening to the second main surface, in the object along each of the plurality of lines to cut.

In the object cutting method, the dry etching is performed, from the second main surface side, on the object in which the fracture is formed to extend between the at least one row of modified regions and the second main surface of the object. At this time, the etching protection layer in which the gas passing region is formed along each of the plurality of lines to cut is formed on the second main surface. In this way, the dry etching is selectively progressed along the fracture from the second main surface, so the groove having a narrow and deep opening is formed along each of the plurality of lines to cut. Therefore, for example, by extending the extension film stuck to the second main surface side where the groove opens, the object can be reliably cut into a plurality of semiconductor chips along each of the lines to cut.

In the object cutting method according to the aspect of the present disclosure, in the fourth step, the dry etching may be performed from the second main surface side so that the etching protection layer remains. In this way, in the semiconductor chip, the etching protection layer can function as a strong reinforcing layer and a gettering layer that traps impurities.

In the object cutting method according to the aspect of the present disclosure, in the fourth step, the dry etching may be performed from the second main surface side so that the etching protection layer is removed. In this way, it is possible to prevent an unnecessary influence from occurring due to the etching protection layer in the semiconductor chip.

In the object cutting method according to an aspect of the present disclosure, in the second step, the at least one row of modified regions is formed along each of the plurality of lines to cut by forming a plurality of rows of modified regions arranged in a thickness direction of the object, and the fracture may be formed to extend between modified regions adjacent to each other among the plurality of rows of modified regions. In this way, it is possible to selectively progress the dry etching more deeply.

In the object cutting method according to an aspect of the present disclosure, in the second step, the at least one row of modified regions may be formed along each of the plurality of lines to cut by forming a plurality of modified spots arranged along each of the plurality of lines to cut, and the fracture may be formed to extend between modified spots adjacent to each other among the plurality of modified spots. In this way, it is possible to selectively progress the dry etching with higher efficiency.

The object cutting method according to the aspect of the present disclosure may further include: a fifth step of, after the fourth step, cutting the object into a plurality of semiconductor chips along each of the plurality of lines to cut by sticking an extension film to the second main surface side and extending the extension film. In this way, it is possible to reliably cut the object into the plurality of semiconductor chips along each of the lines to cut. Further, since the plurality of semiconductor chips are separated from each other on the extension film, the pickup of the semiconductor chips can be facilitated.

An object cutting method according to another aspect of the present disclosure includes: a first step of preparing an object to be processed including a single crystal silicon substrate and a functional device layer provided on a first main surface side; a second step of, after the first step, irradiating the object with laser light to form at least one row of modified regions in the single crystal silicon substrate along each of a plurality of lines to cut and to form a fracture in the object so as to extend between the at least one row of modified regions and the first main surface along each of the plurality of lines to cut; a third step of, after the second step, forming an etching protection layer having a gas passing region formed along each of the plurality of lines to cut, on the first main surface; and a fourth step of, after the third step, performing dry etching on the object from the first main surface side, in a state in which the etching protection layer is formed on the first main surface, to form a groove opening to the first main surface, in the object along each of the plurality of lines to cut.

In the object cutting method, the dry etching is performed, from the first main surface side, on the object in which the fracture is formed to extend between the at least one row of modified regions and the first main surface of the object. At this time, the etching protection layer in which the gas passing region is formed along each of the plurality of lines to cut is formed on the first main surface. In this way, the dry etching is selectively progressed along the fracture from the first main surface, so the groove having a narrow and deep opening is formed along each of the plurality of lines to cut. Therefore, for example, by extending the extension film stuck to the second main surface side, the object can be reliably cut into a plurality of semiconductor chips along each of the lines to cut.

Advantageous Effects of Invention

According to the present disclosure, it is possible to provide an object cutting method in which it is possible to reliably cut an object to be processed into a plurality of semiconductor chips.

BRIEF DESCRIPTION OF DRAWINGS

FIG. 7 is a sectional view illustrating an experimental result on an object cutting method.

FIG. 8 is a sectional view illustrating an experimental result on the object cutting method.

FIG. 9 is a sectional view illustrating an experimental result on the object cutting method.

FIG. 10 is a sectional view illustrating an experimental result on the object cutting method.

FIG. 12 is a diagram illustrating an experimental result on the object cutting method.

FIG. 15 is a diagram illustrating an experimental result on the object cutting method.

FIG. 16 is a diagram illustrating an experimental result on the object cutting method.

FIG. 18 is a diagram illustrating an experimental result on the object cutting method.

FIG. 19 is a diagram illustrating an experimental result on the object cutting method.

FIG. 22 is a sectional view illustrating an object cutting method according to a one embodiment.

FIG. 23 is a sectional view illustrating the object cutting method according to the one embodiment.

FIG. 24 is a sectional view illustrating the object cutting method according to the one embodiment.

FIG. 25 is a sectional view illustrating the object cutting method according to the one embodiment.

FIG. 28 is a sectional view illustrating the object cutting method according to the one embodiment.

FIG. 30 is a sectional view illustrating the object cutting method according to the one embodiment.

FIG. 33 is a sectional view illustrating the object cutting method according to the one embodiment.

FIG. 35 is a sectional view illustrating the object cutting method according to the one embodiment.

FIG. 36 is a sectional view illustrating the object cutting method according to the one embodiment.

FIG. 37 is a sectional view illustrating the object cutting method according to the one embodiment.

FIG. 38 is a sectional view illustrating the object cutting method according to the one embodiment.

FIG. 39 is a sectional view illustrating the object cutting method according to the one embodiment.

DESCRIPTION OF EMBODIMENTS

Figure 1:
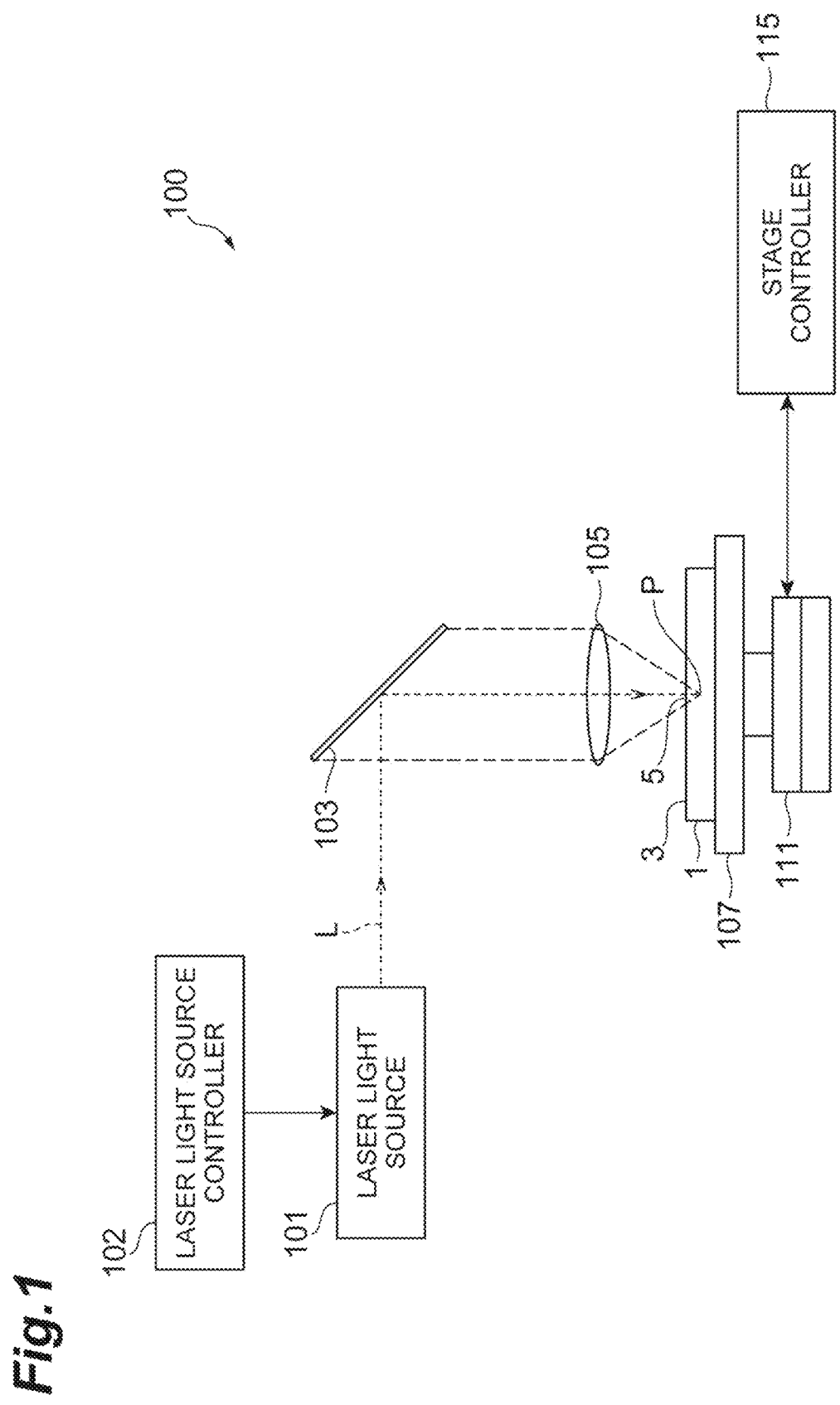
FIG. 1 is a schematic structural diagram of a laser processing apparatus used for forming a modified region.

Hereinafter, embodiments of the present disclosure will be explained in detail with reference to drawings. In the drawings, the same or equivalent parts will be denoted by the same reference signs, without redundant description.

In an object cutting method according to an embodiment, laser light is converged at an object to be processed to form a modified region within the object along a line to cut. Therefore, forming of the modified region will be explained at first with reference to FIGS. 1 to 6.

As illustrated in FIG. 1, a laser processing apparatus 100 includes a laser light source 101 that causes laser light L to oscillate in a pulsating manner and is a laser light emission unit, a dichroic mirror 103 disposed to change a direction of the optical axis (optical path) of the laser light L by 90°, and a converging lens 105 configured to converge the laser light L. The laser processing apparatus 100 further includes a support table 107 for supporting an object to be processed 1 irradiated with the laser light L converged by the converging lens 105, a stage 111 for moving the support table 107, a laser light source controller 102 for controlling regulating the laser light source 101 in order to adjust the output (pulse energy, light intensity), the pulse width, the pulse waveform, and the like of the laser light L, and a stage controller 115 for regulating the movement of the stage 111.

In the laser processing apparatus 100, the laser light L emitted from the laser light source 101 changes the direction of its optical axis by 90° with the dichroic mirror 103 and then is converged by the converging lens 105 into the object 1 mounted on the support table 107. At the same time, the stage 111 is shifted, so that the object 1 moves relative to the laser light L along a line 5 to cut. This forms a modified region in the object 1 along the line 5 to cut. While the stage 111 is shifted here for relatively moving the laser light L, the converging lens 105 may be shifted instead or together therewith.

Figure 2:
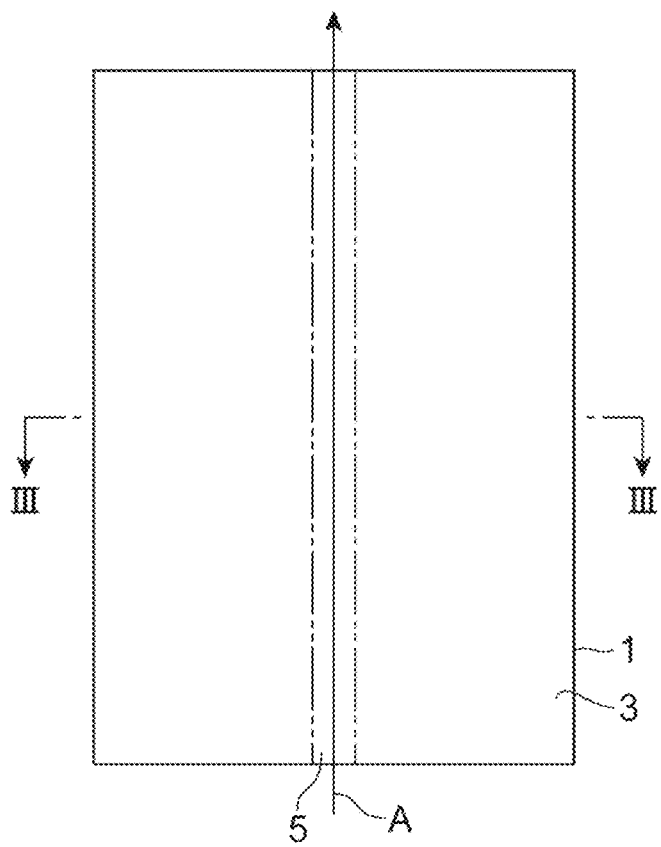
FIG. 2 is a plan view of an object to be processed as a target for forming the modified region.
Figure 3:
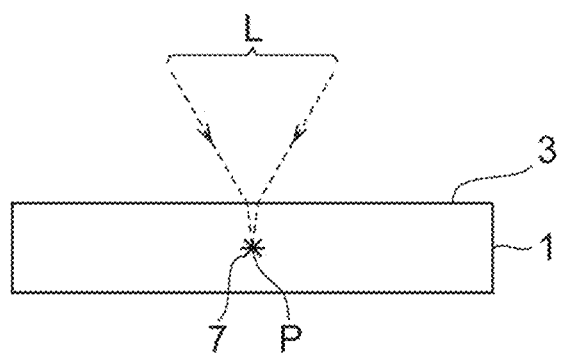
FIG. 3 is a sectional view of the object taken along the line III-III of FIG. 2.
Figure 4:
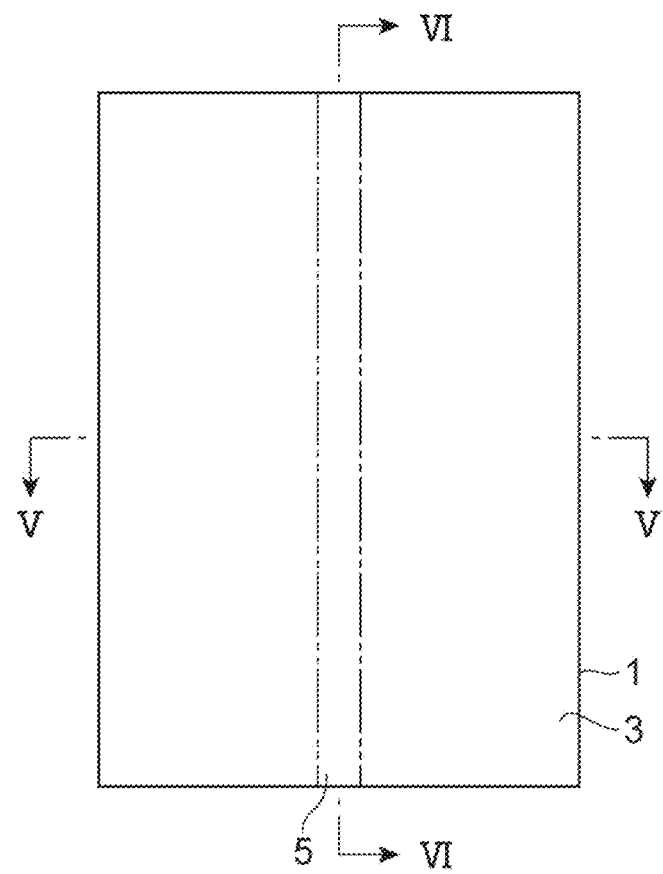
FIG. 4 is a plan view of the object after laser processing.
Figure 5:
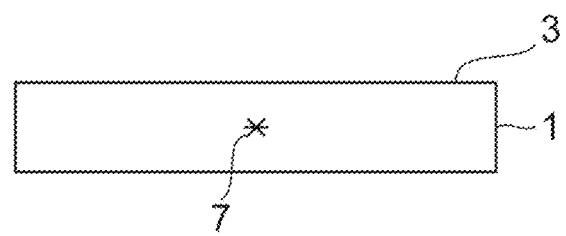
FIG. 5 is a sectional view of the object taken along the line V-V of FIG. 4.
Figure 6:
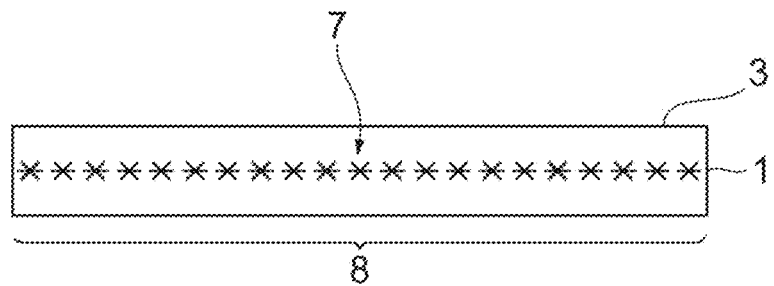
FIG. 6 is a sectional view of the object taken along the line VI-VI of FIG. 4.

Employed as the object 1 is a planar member (for example, a substrate or a wafer), examples of which include semiconductor substrates formed of semiconductor materials and piezoelectric substrates formed of piezoelectric materials. As illustrated in FIG. 2, in the object 1, the line 5 to cut is set for cutting the object 1. The line 5 to cut is a virtual line extending straight. When forming a modified region within the object 1, the laser light L is relatively moved along the line 5 to cut (that is, in the direction of arrow A in FIG. 2) while locating a converging point (converging position) P within the object 1 as illustrated in FIG. 3. This forms a modified region 7 in the object 1 along the line 5 to cut as illustrated in FIG. 4, FIG. 5 and FIG. 6, and the modified region 7 formed along the line 5 to cut acts as a cutting start region 8.

The converging point P is a position at which the laser light L is converged. The line 5 to cut may be curved instead of being straight, a three-dimensional one combining them, or one specified by coordinates. The line 5 to cut may be one actually drawn on a front surface 3 of the object 1 without being restricted to the virtual line. The modified region 7 may be formed either continuously or intermittently. The modified region 7 may be formed either in rows or dots and may be formed at least in the object 1. There are cases where fractures are formed from the modified region 7 acting as a start point, and the fractures and modified region 7 may be exposed at outer surfaces (front surface 3, rear surface, and outer peripheral surface) of the object 1. The laser light entrance surface for forming the modified region 7 is not limited to the front surface 3 of the object 1 but may be the rear surface of the object 1.

In a case where the modified region 7 is formed in the object 1, the laser light L is transmitted through the object 1 and absorbed, in particular, in the vicinity of the converging point P in the object 1. Thus, the modified region 7 is formed in the object 1 (that is, internal absorption laser processing). In this case, the front surface 3 of the object 1 hardly absorbs the laser light L, and thus does not melt. In a case where the modified region 7 is formed on the front surface 3 or the rear surface of the object 1, the laser light L is absorbed, in particular, in the vicinity of the converging point P on the front surface 3 or the rear surface. Thus, the front surface 3 or the rear surface is melted and removed, and a removed portion such as a hole or a groove is formed (surface absorption laser processing).

The modified region 7 refers to a region having physical characteristics such as density, a refractive index, and mechanical strength, which have attained states different from those of their surroundings. Examples of the modified region 7 include molten processed regions (meaning at least one of regions resolidified after having been once molten, those in the molten state, and those in the process of resolidifying from the molten state), crack regions, dielectric breakdown regions, refractive index changed regions, and their mixed regions. Other examples of the modified region 7 include areas where the density of the modified region 7 has changed from that of an unmodified region and areas formed with a lattice defect in a material of the object 1. In a case where the material of the object 1 is single crystal silicon, the modified region 7 also refers to a high dislocation density region.

The molten processed regions, refractive index changed regions, areas where the modified region 7 has a density different from that of the unmodified region, and areas formed with a lattice defect may further incorporate a fracture (cut or microcrack) therein or at an interface between the modified region 7 and the unmodified region. The incorporated fracture may be fanned over the whole surface of the modified region 7 or in only some or a plurality of parts thereof. The object 1 includes a substrate made of a crystal material having a crystal structure. For example, the object 1 includes a substrate made of at least any of gallium nitride (GaN), silicon (Si), silicon carbide (SiC), $LiTaO_3$, and sapphire ($Al_2O_3$). In other words, the object 1 includes a gallium nitride substrate, a silicon substrate, a SiC substrate, a $LiTaO_3$ substrate, or a sapphire substrate, for example. The crystal material may be either anisotropic crystal or isotropic crystal. The object 1 may include a substrate made of an amorphous material having an amorphous structure (non-crystalline structure) or may include, for example, a glass substrate.

In the embodiment, the modified region 7 can be formed by forming a plurality of modified spots (processing scars) along the line 5 to cut. In this case, the modified region 7 is formed by integrating the plurality of modified spots. The modified spot is a modified portion formed by a shot of one pulse of pulsed laser light (that is, one pulse of laser irradiation: laser shot). Examples of the modified spots include crack spots, molten processed spots, refractive index changed spots, and those in which at least one of them is mixed. As for the modified spots, their size and lengths of fractures occurring therefrom can be controlled as necessary in view of the required cutting accuracy, the demanded flatness of cut surfaces, the thickness, kind, and crystal orientation of the object 1, and the like. In the embodiment, the modified spots can be formed along the line 5 to cut, for the modified region 7.

[Experimental Result on Object Cutting Method]

Firstly, an example of an object cutting method will be explained with reference to FIGS. 7 to 10. Constituents illustrated in FIGS. 7 to 10 are schematic, and an aspect ratio and the like of each constituent are different from those of the practical one.

As illustrated in FIG. 7(*a*), an object to be processed 1 including a single crystal silicon substrate 11 and a functional device layer 12 provided on a first main surface 1*a* side is prepared, and a protective film 21 is stuck to the first main surface 1*a* of the object 1. The functional device layer 12 includes a plurality of functional devices 12*a* (light receiving device such as a photodiode, a light emitting device such as a laser diode, or a circuit device formed as a circuit, and the like) arranged along the first main surface 1*a* in a matrix, for example. A second main surface 1*b* of the object 1 (main surface on an opposite side of the first main surface 1*a*) is a surface of the single crystal silicon substrate 11 on an opposite side of the functional device layer 12.

As illustrated in FIG. 7(*b*), if the object 1 is irradiated with laser light L by using the second main surface 1*b* as a laser light entrance surface, a plurality of rows of modified regions 7 is formed in the single crystal silicon substrate 11 along each of a plurality of lines 5 to cut, and a fracture 31 is formed in the object 1 along each of the plurality of lines 5 to cut. The plurality of lines 5 to cut is set in, for example, a grid so as to pass between the functional device 12a adjacent to each other in a case of being viewed from a thickness direction of the object 1. A plurality of rows of modified regions 7 formed along each of the plurality of lines 5 to cut is arranged in the thickness direction of the object 1. The fracture 31 extends at least between one row of modified regions 7 on the second main surface 1b side and the second main surface 1b.

If, as illustrated in FIG. 8(a), dry etching is performed on the object 1 from the second main surface 1b side, a groove 32 is formed in the object 1 along each of the plurality of lines 5 to cut, as illustrated in FIG. 8(b). The groove 32 is, for example, a V groove (groove having a V-shaped section) opening to the second main surface 1b. Dry etching selectively progresses from the second main surface 1b side along the fracture 31 (that is, along each of the plurality of lines 5 to cut), and thereby the groove 32 is formed. Then, an uneven region 9 is formed on the inner surface of the groove 32 in a manner that one row of modified region 7 on the second main surface 1b side is removed by dry etching. The uneven region 9 has an uneven shape corresponding to the one row of modified regions 7 on the second main surface 1b side. Details thereof will be described later.

Performing dry etching on the object 1 from the second main surface 1b side has the meaning that dry etching is performed on the single crystal silicon substrate 11 in a state where the first main surface 1a is covered with the protective film and the like, and the second main surface 1b (or etching protection layer (described later) 23 in which a gas passage region is formed along each of the plurality of lines 5 to cut) is exposed to an etching gas. In particular, in a case of performing reactive ion etching (plasma etching), performing dry etching means irradiation of the second main surface 1b (or etching protection layer (described later) 23 in which a gas passage region is formed along each of the plurality of lines 5 to cut) with reactive species in plasma.

Then, as illustrated in FIG. 9(a), an extension film 22 is stuck to the second main surface 1b of the object 1. As illustrated in FIG. 9(b), the protective film 21 is removed from the first main surface 1a of the object 1. As illustrated in FIG. 10(a), if the extension film 22 is extended, the object 1 is cut into a plurality of semiconductor chips 15 along each of the plurality of lines 5 to cut. Then, as illustrated in FIG. 10(b), the semiconductor chips 15 are picked up.

Next, an experimental result in a case of performing dry etching after the modified region is formed as in the above-described example of the object cutting method will be explained.

Figure 11:
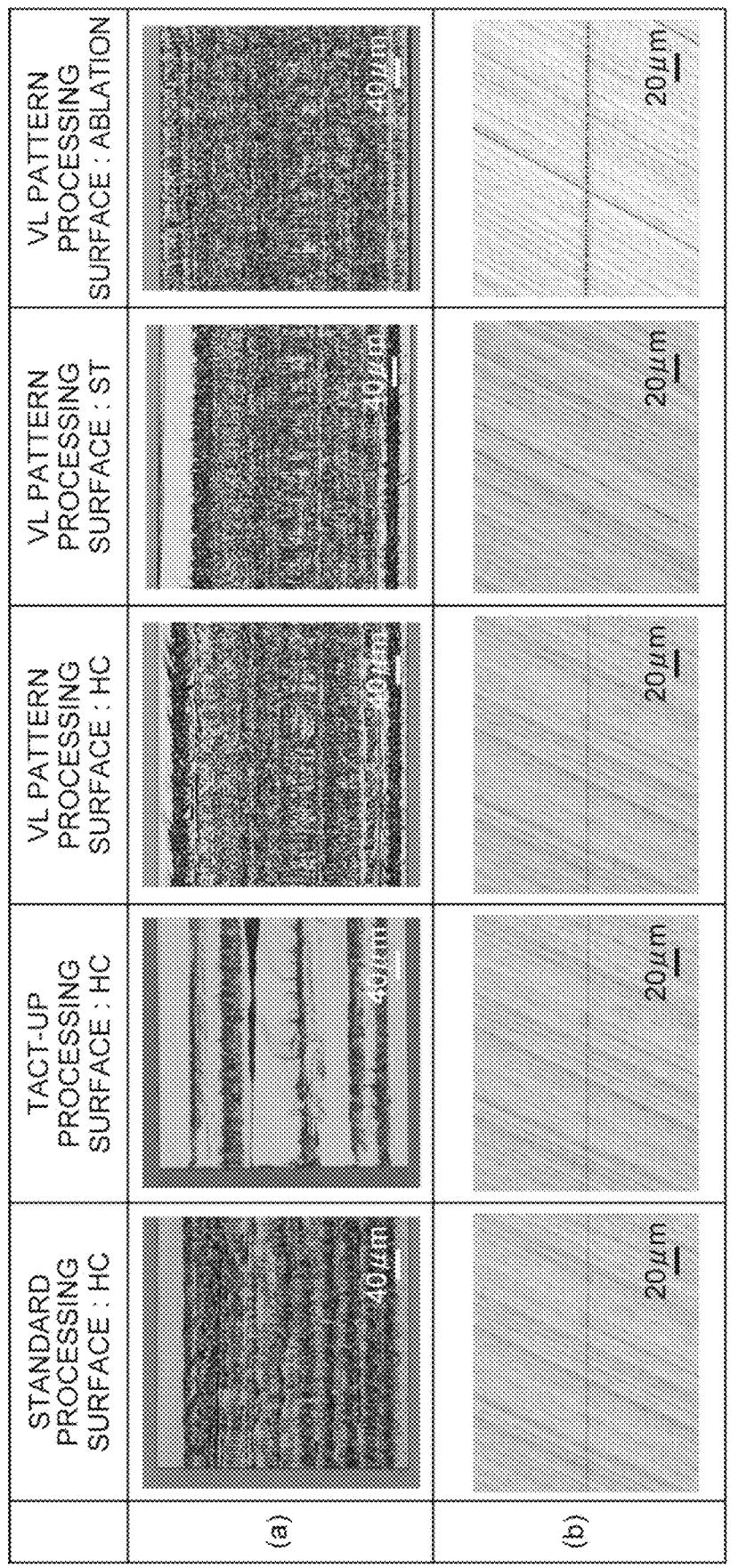
FIG. 11 is a diagram illustrating an experimental result on the object cutting method.

In a first experiment (see FIGS. 11 and 12), a plurality of lines to cut was set in stripes on a single crystal silicon substrate having a thickness of 400 μm, at an interval of 2 mm. Then, a plurality of rows of modified regions arranged in a thickness direction of the single crystal silicon substrate was formed in the single crystal silicon substrate along each of the plurality of lines to cut. (a) in FIG. 11 is a section picture (accurately, picture of a cut surface when the single crystal silicon substrate is cut before reactive ion etching described later is performed) of the single crystal silicon substrate after the modified region is formed. (b) in FIG. 11 is a plan picture of the single crystal silicon substrate after the modified region is formed. Hereinafter, the thickness direction of the single crystal silicon substrate is simply referred to as "the thickness direction", and one surface (in (a) in FIG. 11, upper surface of the single crystal silicon substrate) in a case where dry etching is performed on the single crystal silicon substrate from the one surface side is simply referred to as "one surface".

In FIG. 11, "standard processing, surface: HC" means a state where one row of modified regions on one surface side is separated from the one surface, and a fracture reaches the one surface from the one row of modified regions, in a case where laser light is converged by natural spherical aberration (aberration which occurs naturally at a converging position in accordance with Snell's law or the like due to converging of the laser light on the object), and a state where fractures respectively extending from the modified region in the thickness direction are connected to each other. "Tact-up processing, surface: HC" means a state where one row of modified regions on one surface side is separated from the one surface, and a fracture reaches the one surface from the one row of modified regions, in a case where laser light is converged such that the length of a converging point in an optical axis direction becomes shorter than natural spherical aberration by aberration correction, and a state where fractures respectively extending from the modified region in the thickness direction are connected to each other at black streak portions viewed in (a) in FIG. 11.

"VL pattern processing surface: HC" means a state where one row of modified regions on one surface side is separated from the one surface, and a fracture reaches the one surface from the one row of modified regions, in a case where laser light is converged such that the length of the converging point in the optical axis direction becomes longer than natural spherical aberration by imparting aberration. "VL pattern processing surface: ST" means a state where one row of modified regions on one surface side is separated from the one surface, and a fracture does not reach the one surface from the one row of modified regions, in a case where laser light is converged such that the length of the converging point in the optical axis direction becomes longer than natural spherical aberration by imparting aberration. "VL pattern processing surface: ablation" means a state where one row of modified regions on one surface side is exposed to the one surface in a case where laser light is converged such that the length of the converging point in the optical axis direction becomes longer than natural spherical aberration by imparting aberration.

After the modified regions were formed as described above, reactive ion etching with $CF_4$ (carbon tetrafluoride) was performed on the one surface of the single crystal silicon substrate for 60 minutes. FIG. 12 illustrates results thereof. (a) in FIG. 12 is a plan picture of the single crystal silicon substrate after reactive ion etching is performed. (b) in FIG. 12 is a section picture (picture of a cut surface perpendicular to the line to cut) of the single crystal silicon substrate after reactive ion etching is performed.

Figure 13:
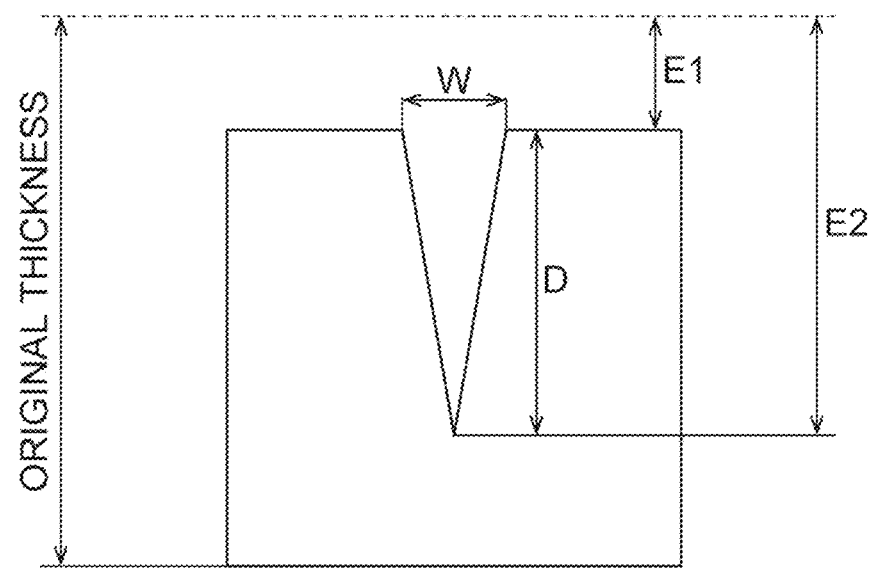
FIG. 13 is a diagram illustrating an experimental result on the object cutting method.

Here, definitions of tell is illustrated in FIG. 12 will be explained with reference to FIG. 13. "Groove width" indicates a width W of an opening of a groove formed by dry etching. "Groove depth" indicates a depth D of the groove formed by dry etching. "Groove aspect ratio" indicates a value obtained by dividing D by W. "Si etching amount" indicates a value E1 obtained by subtracting the thickness of the single crystal silicon substrate subjected to dry etching from the thickness (original thickness) of the single crystal silicon substrate before dry etching is performed. "SD etching amount" indicates a value E2 obtained by adding D to E1. "Etching time" indicates a time T in which dry etching has been performed. "Si etching rate" indicates a value obtained by dividing E1 by T. "SD etching rate" indicates a value obtained by dividing E2 by T. "Etching rate ratio" indicates a value obtained by dividing E2 by E1.

The followings are understood from the results of the first experiment illustrated in FIG. 12. That is, if the fracture reaches one surface (one surface in a case where dry etching is performed on the single crystal silicon substrate from the one surface side), dry etching progresses selectively (that is, at a high etching rate ratio) from the one surface side along the fracture within a range in which fractures are connected to each other. Thus, a groove having an opening which is narrow in width and is deep (that is, the groove aspect ratio is high) is formed (comparison of "VL pattern processing surface: ST" and "VL pattern processing surface: ablation" to "standard processing surface: HC"). The fracture significantly contributes to selective progress of dry etching more than the modified region itself (comparison of "VL pattern processing surface: HC" and "VL pattern processing surface: ablation" to "standard processing surface: HC"). If the fractures extending from the modified regions in the thickness direction are not connected to each other, selective progress of dry etching is stopped at a portion (black streak portion viewed in (a) in FIG. 11) in which the fractures are not connected to each other (comparison of "tact-up processing surface: HC" to "standard processing surface: HC"). Stopping the selective progress of dry etching means that a progress speed of dry etching decreases.

In a second experiment (see FIGS. 14 and 15), a plurality of lines to cut was set in stripes on a single crystal silicon substrate having a thickness of 100 μm, at an interval of 100 μm. Then, two rows of modified regions arranged in a thickness direction of the single crystal silicon substrate were faulted in the single crystal silicon substrate along each of the plurality of lines to cut. Here, a state where the modified regions adjacent to each other in the thickness direction are separated from each other, and fractures extending from the modified regions in the thickness direction reach both one surface and the other surface (surface on an opposite side of the one surface) occurred. Reactive ion etching with $CF_4$ was performed on the one surface of the single crystal silicon substrate.

Figure 14:
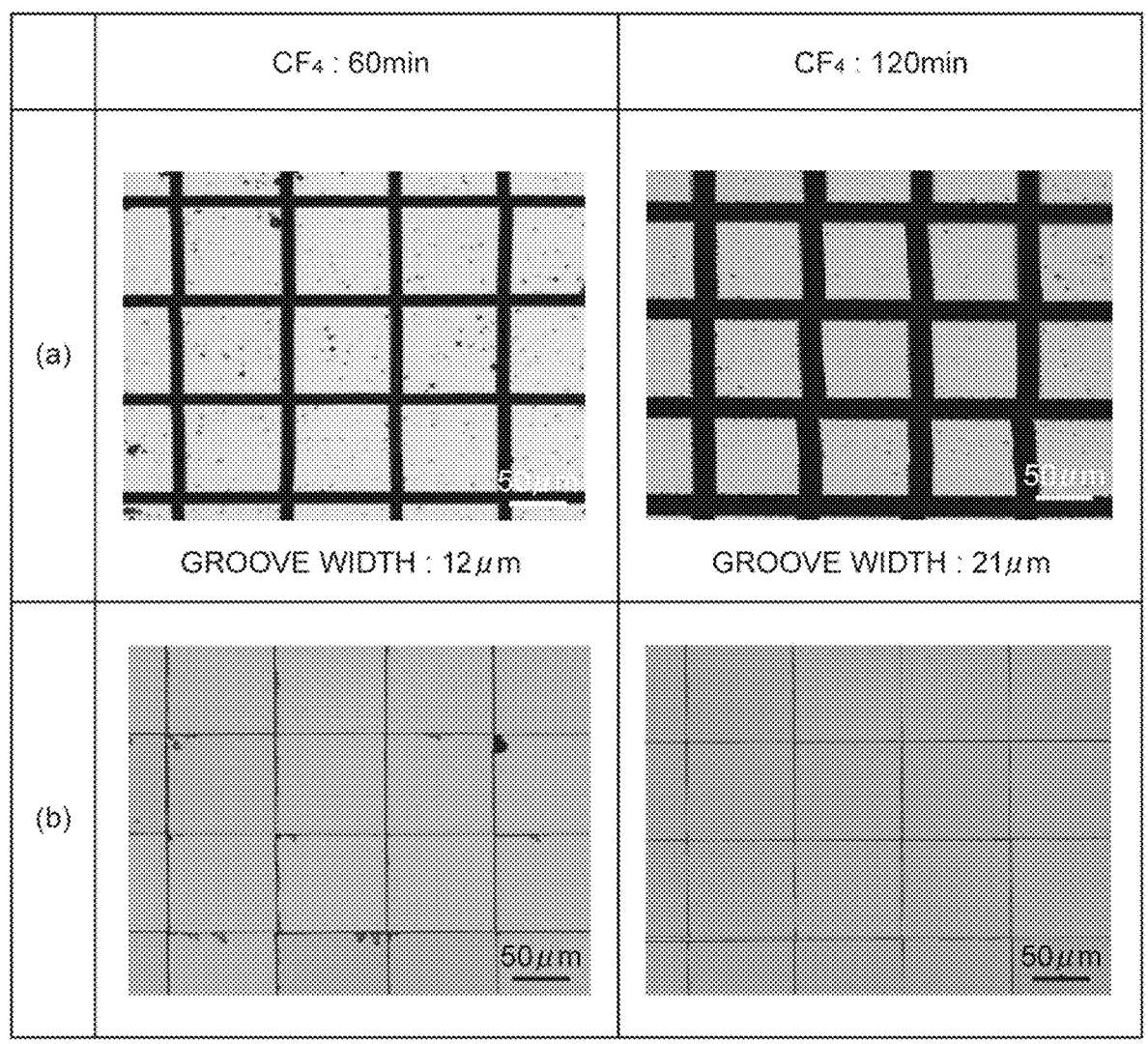
FIG. 14 is a diagram illustrating an experimental result on the object cutting method.

FIGS. 14 and 15 illustrate results of the second experiment. In FIGS. 14 and 15, "$CF_4$: 60 min" indicates a case where reactive ion etching with $CF_4$ was performed for 60 minutes. "$CF_4$: 120 min" indicates a case where reactive ion etching with $CF_4$ was performed for 120 minutes. (a) in FIG. 14 is a plan picture (picture of the one surface) of the single crystal silicon substrate before reactive ion etching is performed. (b) in FIG. 14 is a bottom picture (picture of the other surface) of the single crystal silicon substrate after reactive ion etching is performed. (a) in FIG. 15 is a side picture of a single crystal silicon chip obtained by cutting the single crystal silicon substrate along each of the plurality of lines to cut. (b) FIG. 15 is a diagram illustrating dimensions of the single crystal silicon chip. In (a) and (b) in FIG. 15, the one surface of the single crystal silicon substrate is on the lower side.

The followings are understood from the results of the second experiment illustrated in FIGS. 14 and 15. That is, if the fracture reaches one surface (one surface in a case where dry etching is performed on the single crystal silicon substrate from the one surface side), dry etching progresses selectively (that is, at a high etching rate ratio) from the one surface side along the fracture within a range in which fractures are connected to each other. Thus, a groove having an opening which is narrow in width and is deep (that is, the groove aspect ratio is high) is formed. If fractures extending from the modified regions in the thickness direction reach both one surface and the other surface, it is possible to completely chip the single crystal silicon substrate only by dry etching. If an extension film stuck to the other surface of the single crystal silicon substrate is extended in a case of "$CF_4$: 60 min", it is possible to cut the single crystal silicon substrate having a rectangular shape of 50 mm×50 mm into chips of 100 μm×100 μm at a ratio of 100%.

In a third experiment (see FIG. 16), a plurality of lines to cut was set in stripes on a single crystal silicon substrate having a thickness of 400 μm, at an interval of 2 mm. Then, a plurality of rows of modified regions arranged in a thickness direction of the single crystal silicon substrate was formed in the single crystal silicon substrate along each of the plurality of lines to cut. A state where one row of modified regions on one surface side is separated from the one surface, and a fracture reaches the one surface from the one row of modified regions, in a case where laser light is converged by natural spherical aberration, and a state where fractures extending from the modified regions in the thickness direction are connected to each other occurred. Reactive ion etching was performed on the one surface of the single crystal silicon substrate.

FIG. 16 illustrates results of the third experiment. In FIG. 16, "$CF_4$ (RIE)" indicates a case where reactive ion etching with $CF_4$ was performed by a reactive ion etching (RIE) apparatus, "$SF_6$ (RIE)" indicates a case where reactive ion etching with sulfur hexafluoride ($SF_6$) was performed by a RIE apparatus, and "$SF_6$ (DRIE)" indicates a case where reactive ion etching with $SF_6$ was performed by a deep reactive ion etching (DRIE) apparatus. (a) in FIG. 16 is a plan picture of the single crystal silicon substrate after reactive ion etching is performed. (b) in FIG. 16 is a section picture (picture of a cut surface perpendicular to the line to cut) of the single crystal silicon substrate after reactive ion etching is performed.

The followings are understood from the results of the third experiment illustrated in FIG. 16. That is, even though reactive ion etching with $CF_4$ requires longer time than reactive ion etching with $SF_6$, from a point that it is possible to ensure a high etching rate ratio and a high groove aspect ratio, reactive ion etching with $CF_4$ is more advantageous than reactive ion etching with $SF_6$, for ensuring the uniform Si etching amount.

Figure 17:
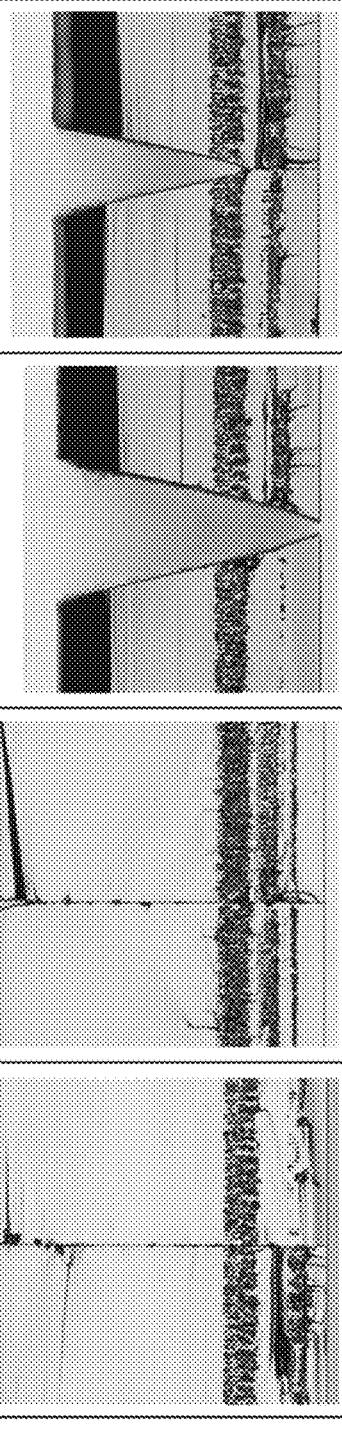
FIG. 17 is a diagram illustrating an experimental result on the object cutting method.

In a fourth experiment (see FIG. 17), a plurality of lines to cut was set in stripes on a single crystal silicon substrate having a thickness of 400 μm, at an interval of 2 mm. Then, a plurality of rows of modified regions arranged in a thickness direction of the single crystal silicon substrate was formed in the single crystal silicon substrate along each of the plurality of lines to cut. In FIG. 17, "$CF_4$ (RIE): 30 min, surface: HC", "$CF_4$ (RIE): 60 min, surface: HC", and "$CF_4$ (RIE): 6 H, surface: HC" mean a state where one row of modified regions on one surface side is separated from the one surface, and a fracture reaches the one surface from the one row of modified regions, in a case where laser light is converged by natural spherical aberration, and a state where fractures extending from the modified regions in the thickness direction are connected to each other. "$CF_4$ (RIE): 6 H, surface: ST" means a state where one row of modified regions on one surface side is separated from the one surface, and a fracture does not reach the one surface from the one row of modified regions, in a case where laser light is converged by natural spherical aberration, and a state where fractures extending from the modified regions in the thickness direction are connected to each other.

Reactive ion etching with $CF_4$ was performed on the one surface of the single crystal silicon substrate. In FIG. 17, "$CF_4$ (RIE): 30 min, surface: HC", "$CF_4$ (RIE): 60 min, surface: HC", "$CF_4$ (RIE): 6 H, surface: HC", and "$CF_4$ (RIE): 6 H, surface: ST" mean that reactive ion etching with $CF_4$ was performed for 30 minutes, 60 minutes, 6 hours, and 6 hours, respectively, by the RIE apparatus.

FIG. 17 illustrates results of the fourth experiment. (a) in FIG. 17 is a section picture (picture of a cut surface perpendicular to the line to cut) of the single crystal silicon substrate after reactive ion etching is performed.

The followings are understood from the results of the fourth experiment illustrated in FIG. 17. That is, if the fracture reaches one surface (one surface in a case where dry etching is performed on the single crystal silicon substrate from the one surface side), selective progress of dry etching does not stop (that is, a high etching rate ratio is maintained) in a range in which fractures are connected to each other. Even though the fracture does not reach the one surface, etching from the one surface is in progress. If the fracture appears to the one surface, selective progress of dry etching starts along the fracture. Since it is difficult to stop extension of the fracture at a predetermined depth from the one surface, a timing at the fracture appears to the one surface by the progress of etching varies easily depending on a place. As a result, the width and the depth of an opening of a groove to be formed vary easily depending on the place. Thus, when one row of modified regions on one surface side is formed, it is very important to form the modified regions such that a fracture reaches the one surface.

In a fifth experiment (see FIG. 18), a plurality of lines to cut was set in grid on a single crystal silicon substrate having a thickness of 320 μm, at an interval of 3 mm. Then, a plurality of rows of modified regions arranged in a thickness direction of the single crystal silicon substrate was formed in the single crystal silicon substrate along each of the plurality of lines to cut. A state where one row of modified regions on one surface side is separated from the one surface, and a fracture reaches the one surface from the one row of modified regions, in a case where laser light is converged by natural spherical aberration, and a state where fractures extending from the modified regions in the thickness direction are connected to each other occurred.

Reactive ion etching was performed on the one surface of the single crystal silicon substrate. In FIG. 18, "$CF_4$ (RIE), surface: HC" means that reactive ion etching with $CF_4$ was performed by a RIE apparatus. "$XeF_2$, surface: HC" means that reactive gas etching with xenon difluoride ($XeF_2$) was performed by a sacrificial layer etcher apparatus. "$XeF_2$, surface: HC, $SiO_2$ etching protection layer" means that reactive gas etching with $XeF_2$ was performed by a sacrificial layer etcher apparatus in a state where an etching protection layer made of silicon dioxide ($SiO_2$) was formed on one surface of the single crystal silicon substrate, and a fracture reaches a surface (outer surface on an opposite side of the single crystal silicon substrate) of the etching protection layer from one row of modified regions on the one surface side.

FIG. 18 illustrates results of the fifth experiment. (a) in FIG. 18 is a plan picture of the single crystal silicon substrate before reactive ion etching is performed. (b) in FIG. 18 is a plan picture of the single crystal silicon substrate after reactive ion etching is performed. (c) in FIG. 18 is a section picture (picture of a cut surface perpendicular to the line to cut) of the single crystal silicon substrate after reactive ion etching is performed. A removal width is a width of an opening on the other surface of the single crystal silicon substrate in a case where the groove reaches the other surface.

The followings are understood from the results of the fifth experiment illustrated in FIG. 18. That is, if the etching protection layer made of $SiO_2$ is not formed on one surface of the single crystal silicon substrate (the one surface in a case where dry etching is performed on the single crystal silicon substrate from the one surface side), a difference between reactive ion etching with $CF_4$ and reactive gas etching with $XeF_2$ is not large from a point of ensuring a high etching rate ratio and a high groove aspect ratio. If the etching protection layer made of $SiO_2$ is formed on the one surface of the single crystal silicon substrate, and the fracture reaches the surface of the etching protection layer from one row of modified regions on the one surface side, the etching rate ratio and the groove aspect ratio increase significantly.

In a sixth experiment (see FIG. 19), a plurality of lines to cut was set in grid on a single crystal silicon substrate which has a thickness of 320 μm and in which an etching protection layer made of $SiO_2$ is formed on one surface, at an interval of 3 mm. Then, a plurality of rows of modified regions arranged in a thickness direction of the single crystal silicon substrate was formed in the single crystal silicon substrate along each of the plurality of lines to cut. Reactive gas etching with $XeF_2$ was performed on the one surface of the single crystal silicon substrate by a sacrificial layer etcher apparatus for 180 minutes.

In FIG. 19, "standard processing, surface: HC" means a state where the modified regions adjacent to each other in the thickness direction are separated from each other, one row of modified regions on one surface side is separated from the one surface, and a fracture reaches a surface (outer surface on an opposite side of the single crystal silicon substrate) of the etching protection layer from the one row of modified regions, and a state where fractures extending from the modified regions in the thickness direction are connected to each other. "Standard processing, surface: ST" means a state where the modified regions adjacent to each other in the thickness direction are separated from each other, one row of modified regions on the one surface side is separated from the one surface, and a fracture does not reach the one surface from the one row of modified regions, and a state where fractures extending from the modified regions in the thickness direction are connected to each other.

"Tact-up processing 1, surface: HC" means a state where the modified regions adjacent to each other in the thickness direction are separated from each other, one row of modified regions on the one surface side is separated from the one surface, and a fracture reaches the surface of the etching protection layer from the one row of modified regions, and a state where fractures extending from the modified regions in the thickness direction are connected to each other. "Tact-up processing 2, surface: HC" means a state where the modified regions adjacent to each other in the thickness direction are separated from each other, one row of modified regions on the one surface side is separated from the one surface, and a fracture reaches the surface of the etching protection layer from the one row of modified regions, and a state where some of fractures extending from the modified regions in the thickness direction are connected to each other.

"VL pattern processing, surface: HC" means a state where the modified regions adjacent to each other in the thickness direction are connected to each other, one row of modified regions on the one surface side is separated from the one surface, and a fracture reaches the surface of the etching protection layer from the one row of modified regions. "VL pattern processing, surface: ablation" means a state where the modified regions adjacent to each other in the thickness direction are connected to each other, and the one row of modified regions on the one surface side is exposed to the surface of the etching protection layer.

FIG. 19 illustrates results of the sixth experiment. (a) in FIG. 19 is a section picture (picture of a cut surface perpendicular to the line to cut) of the single crystal silicon substrate after reactive ion etching is performed. (b) in FIG. 19 is a picture of a cut surface of the single crystal silicon substrate after reactive ion etching is performed.

The followings are understood from the results of the fifth experiment illustrated in FIG. 19. That is, if the fracture reaches the surface of the etching protection layer, dry etching progresses selectively (that is, at a high etching rate ratio) from the one surface side along the fracture within a range in which fractures are connected to each other. Thus, a groove having an opening which is narrow in width and is deep (that is, the groove aspect ratio is high) is formed. If the fractures extending from the modified regions in the thickness direction are not connected to each other, dry etching progresses isotropically at a portion in which the fractures are not connected to each other (picture of the (a) field in "tact-up processing 2, surface: HC".

Figure 20:
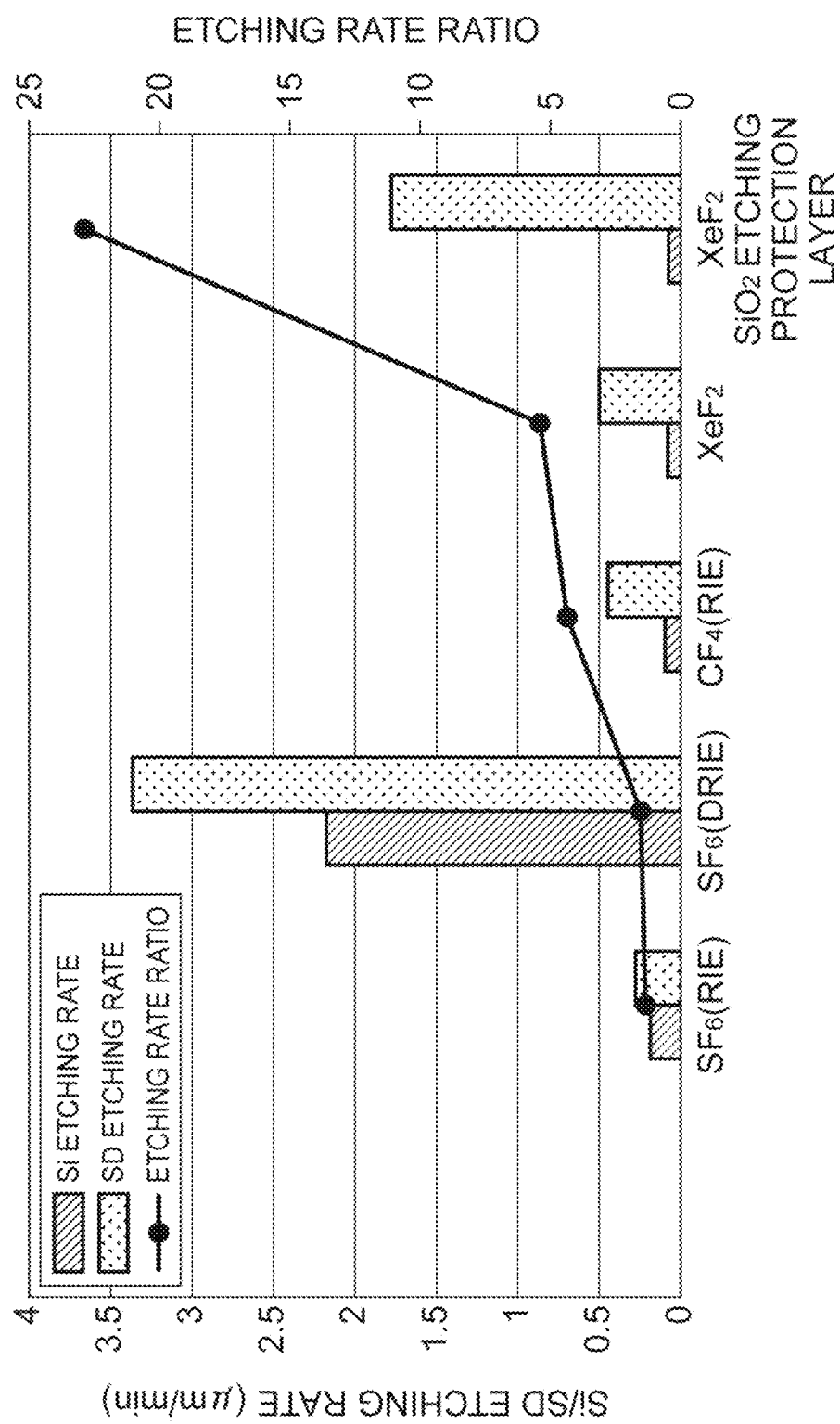
FIG. 20 is a diagram illustrating an experimental result on the object cutting method.

The followings are understood from the experimental results on the above-described object cutting methods. That is, presuming that the fracture reaches the one surface from one row of modified regions on the one surface side (one surface in a case where dry etching is performed on the single crystal silicon substrate from the one surface side) (in a case where the etching protection layer made of $SiO_2$ is formed on the one surface of the single crystal silicon substrate, the fracture reaches the surface of the etching protection layer), within a range in which fractures are connected to each other, as illustrated in FIG. 20, reactive ion etching with $CF_4$ and reactive gas etching with $XeF_2$ can ensure a high reactive gas etching rather than reactive ion etching with $SF_6$. Further, if the etching protection layer made of $SiO_2$ is formed on the one surface of the single crystal silicon substrate, and the fracture reaches the surface of the etching protection layer from one row of modified regions on the one surface side, the etching rate ratio increases significantly. Focusing on the groove aspect ratio, reactive ion etching with $CF_4$ is particularly excellent. Reactive gas etching with $XeF_2$ is advantageous from a point of preventing the decrease of strength of the single crystal silicon substrate by plasma.

Figure 21:
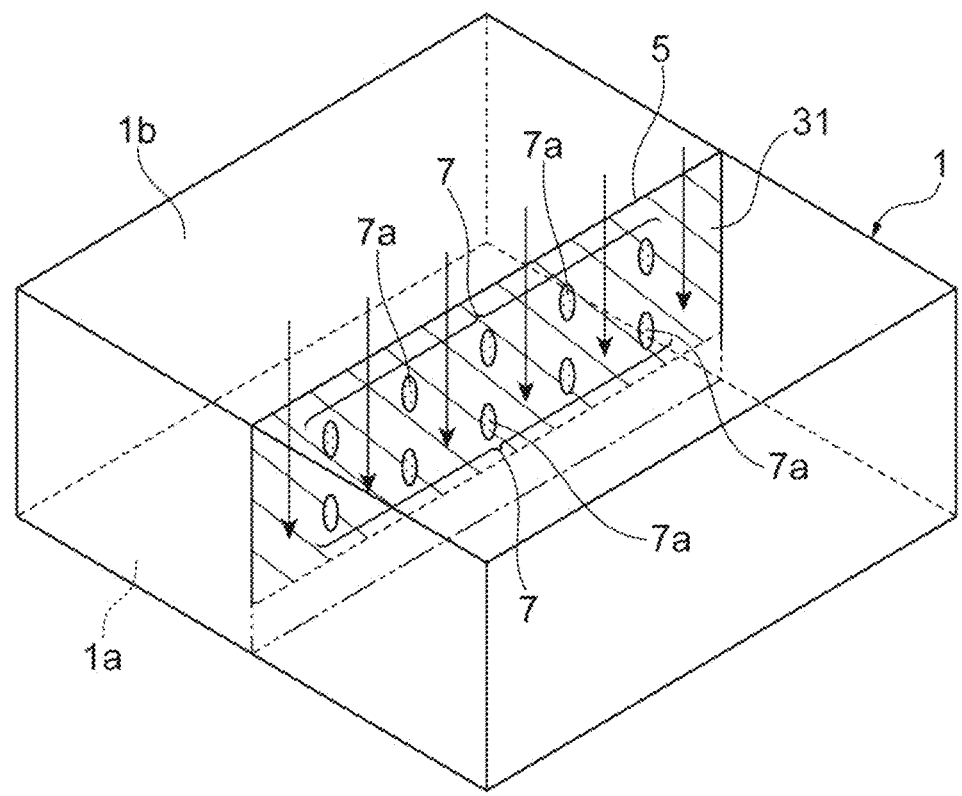
FIG. 21 is a perspective view of the object illustrating an experimental result on the object cutting method.

The principle in which dry etching selectively progresses along a fracture will be explained. If the converging point P of laser light L oscillating in a pulsating mariner is located in the object 1, and the converging point P is relatively moved along the line 5 to cut, as illustrated in FIG. 21, a plurality of modified spots 7a arranged along the line 5 to cut is formed in the object 1. The plurality of modified spots 7a arranged along the line 5 to cut corresponds to one row of modified regions 7.

In a case where a plurality of rows of modified regions 7 arranged in the thickness direction of the object 1 is formed in the object 1, if a fracture 31 is formed to extend between the second main surface 1b and one row of modified regions 7 on the second main surface 1b (second main surface 1b in a case where dry etching is performed on the object 1 from the second main surface 1b side) side of the object 1, an etching gas enters into fractures 31 having intervals of several nm to several in a manner as with capillarity (see an arrow in FIG. 21). Thus, it is supposed that dry etching selectively progresses along the fracture 31.

From this, if the fracture 31 is formed to extend between the modified regions 7 adjacent to each other among the plurality of rows of modified regions 7, it is supposed that dry etching selectively progresses deeper. Further, if the fracture 31 is formed to extend between the modified spots 7a adjacent to each other among the plurality of modified spots 7a arranged along the line 5 to cut, it is supposed that dry etching selectively progresses with higher efficiency. At this time, the etching gas comes into contact with each of the modified spots 7a from the surroundings of the modified spot 7a. Thus, it is supposed that the modified spot 7a having a size of about several μm is removed quickly.

Here, the fracture 31 is different from microcracks included in each modified spot 7a, microcracks randomly formed around each modified spot 7a, and the like. Here, the fracture 31 is a fracture which is parallel to the thickness direction of the object 1 and extends along a plane including the line 5 to cut. In a case where the fracture 31 herein is formed in the single crystal silicon substrate, surfaces (fracture surface facing each other at a distance of several nm to several μm) formed by the fracture 31 are surfaces on which single crystal silicon is exposed. The modified spot 7a formed in the single crystal silicon substrate includes a polycrystalline silicon region, a high dislocation density region, and the like.

One Embodiment

An object cutting method according to a one embodiment will be explained. Constituents illustrated in FIGS. 22 to 26, and 28 to 40 are schematic, and an aspect ratio and the like of each constituent are different from those of the practical one. Firstly, as a first step, as illustrated in FIG. 22(a), an object to be processed 1 including a single crystal silicon substrate 11 and a functional device layer 12 provided on a first main surface 1a side is prepared, and a protective film 21 is stuck to a first main surface 1a of the object 1.

After the first step, as a second step, the object 1 is irradiated with laser light L by using a second main surface 1b as a laser light entrance surface, and thereby a plurality of rows of modified regions 7 is formed in the single crystal silicon substrate 11 along each of a plurality of lines 5 to cut, and a fracture 31 is formed in the object 1 along each of the plurality of lines 5 to cut. A plurality of rows of modified regions 7 formed along each of the plurality of lines 5 to cut is arranged in the thickness direction of the object 1. Each of the plurality of rows of modified regions 7 is constituted by a plurality of modified spots 7a arranged along the line 5 to cut (see FIG. 21). The fracture 31 extends between one row of modified regions 7 on the second main surface 1b side and the second main surface 1b, and between the modified regions 7 adjacent to each other among the plurality of rows of modified regions 7. Further, the fracture 31 extends between the modified spots 7a adjacent to each other among the plurality of modified spots 7a (see FIG. 21).

After the second step, as a third step, as illustrated in FIG. 22(b), an etching protection layer 23 in which the fracture 31 is formed along each of the plurality of lines 5 to cut is formed on the second main surface 1b of the object 1. If an etching protection layer 23 made of $SiO_2$ is formed on the second main surface 1b of the object 1 by vapor deposition, for example, a fracture 31 is formed in the etching protection layer 23 to continue to the fracture 31 formed in the object 1, and the fracture 31 reaches a surface 23a (outer surface on an opposite side of the single crystal silicon substrate 11) of the etching protection layer 23. Here, the fracture 31 formed in the etching protection layer 23 along each of the plurality of lines 5 to cut functions as a gas passage region in the etching protection layer 23.

After the third step, as a fourth step, as illustrated in FIG. 23(a), dry etching is performed on the object 1 from the second main surface 1b side in a state where the etching protection layer 23 is formed on the second main surface 1b, and thereby a groove 32 is formed in the object 1 along each of the plurality of lines 5 to cut, as illustrated in FIG. 23(b). The groove 32 is, for example, a V groove (groove having a V-shaped section) opening to the second main surface 1b. Here, dry etching is performed on the object 1 from the second main surface 1b side with $XeF_2$ (that is, reactive gas etching with $XeF_2$ is performed). Here, dry etching is performed on the object 1 from the second main surface 1b side such that the etching protection layer 23 remains. Further, here, the dry etching is performed on the object 1 from the second main surface 1b such that one row of modified regions 7 on the second main surface 1b side among the plurality of rows of modified regions 7 is removed, and thereby an uneven region 9 having an uneven shape corresponding to the one removed row of modified regions 7 is formed in the inner surface of the groove 32. In a case of forming the uneven region 9, dry etching is preferably performed until the modified region 7 (modified spot 7a) is completely removed from the inner surface of the groove 32. Preferably, dry etching is not performed until the uneven region 9 is completely removed.

After the fourth step, as a fifth step, as illustrated in FIG. 24(a), an extension film 22 is stuck to a surface 23a of the etching protection layer 23 (that is, stuck to the second main surface 1b side of the object 1), and, as illustrated in FIG. 24(b), the protective film 21 is removed from the first main surface 1a of the object 1. As illustrated in FIG.0 25(a), if the extension film 22 is extended, the object 1 is cut into a plurality of semiconductor chips 15 along each of the plurality of lines 5 to cut. Then, as illustrated in FIG. 25(b), the semiconductor chips 15 are picked up.

Figure 26:
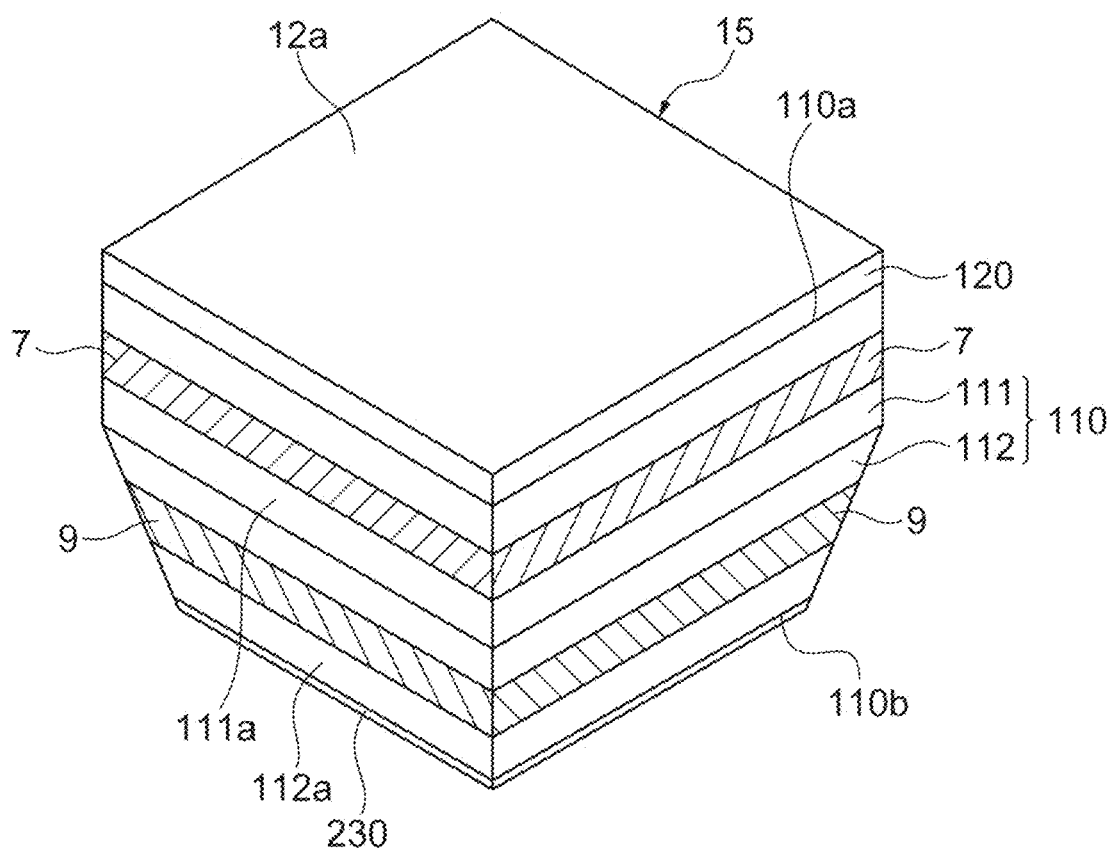
FIG. 26 is a perspective view of a semiconductor chip illustrating the object cutting method according to the one embodiment.

The semiconductor chip 15 obtained by the object cutting method according to the one embodiment as described above will be explained. As illustrated in FIG. 26, the semiconductor chip 15 includes a single crystal silicon substrate 110, a functional device layer 120 provided on a first surface 110a side of the single crystal silicon substrate 110, and an etching protection layer 230 formed on a second surface 110b (surface on an opposite side of the first surface 110a) of the single crystal silicon substrate 110. The single crystal silicon substrate 110 is a portion cut out from the single crystal silicon substrate 11 of the object I (see FIG. 25). The functional device layer 120 is a portion cut out from the functional device layer 12 of the object 1 (see FIG. 25) and includes one functional device 12a. The etching protection layer 230 is a portion cut out from the etching protection layer 23 (see FIG. 25).

The single crystal silicon substrate 110 includes a first portion 111 and a second portion (portion) 112. The first portion 111 is a portion on the first surface 110a side. The second portion 112 is a portion on the second surface 110b side. The second portion 112 has a shape which becomes thinner as becoming farther from the first surface 110a. The second portion 112 corresponds to a portion at which the groove 32 is formed in the single crystal silicon substrate 11 of the object 1 (that is, a portion at which dry etching has progressed) (see FIG. 25). As an example, the first portion 111 has a quadrangular plate shape (rectangular parallelepiped shape). The second portion 112 has a quadrangular pyramid shape which becomes thinner as becoming farther from the first portion 111.

A modified region 7 is formed in the side surface 111a of the first portion 111 to have a band shape. That is, the modified region 7 extends in a direction parallel to the first surface 110a along each side surface 111a, in each side surface 111a. The modified region 7 on the first surface 110a side is separated from the first surface 110a. The modified region 7 is constituted by a plurality of modified spots 7a (see FIG. 21). The plurality of modified spots 7a is arranged in the direction parallel to the first surface 110a along each side surface 111a, in each side surface 111a. The modified region 7 (more specifically, each modified spot 7a) includes a polycrystalline silicon region, a high dislocation density region, and the like.

An uneven region 9 is formed in the side surface 112a of the second portion 112 to have a band shape. That is, the uneven region 9 extends in a direction parallel to the second surface 110b along each side surface 112a, in each side surface 112a. The uneven region 9 on the second surface 110b side is separated from the second surface 110b. The uneven region 9 is formed by removing the modified region 7 on the second main surface 1b side of the object 1 by dry etching (see FIG. 25). Thus, the uneven region 9 has an uneven shape corresponding to the modified region 7, and single crystal silicon is exposed in the uneven region 9. That is, the side surface 112a of the second portion 112 serves as a surface which includes an uneven surface of the uneven region 9 and in which single crystal silicon is exposed.

The semiconductor chip 15 may not include the etching protection layer 230. Such a semiconductor chip 15 is obtained, for example, in a case where dry etching is performed from the second main surface 1b side to remove the etching protection layer 23.

Figure 27:
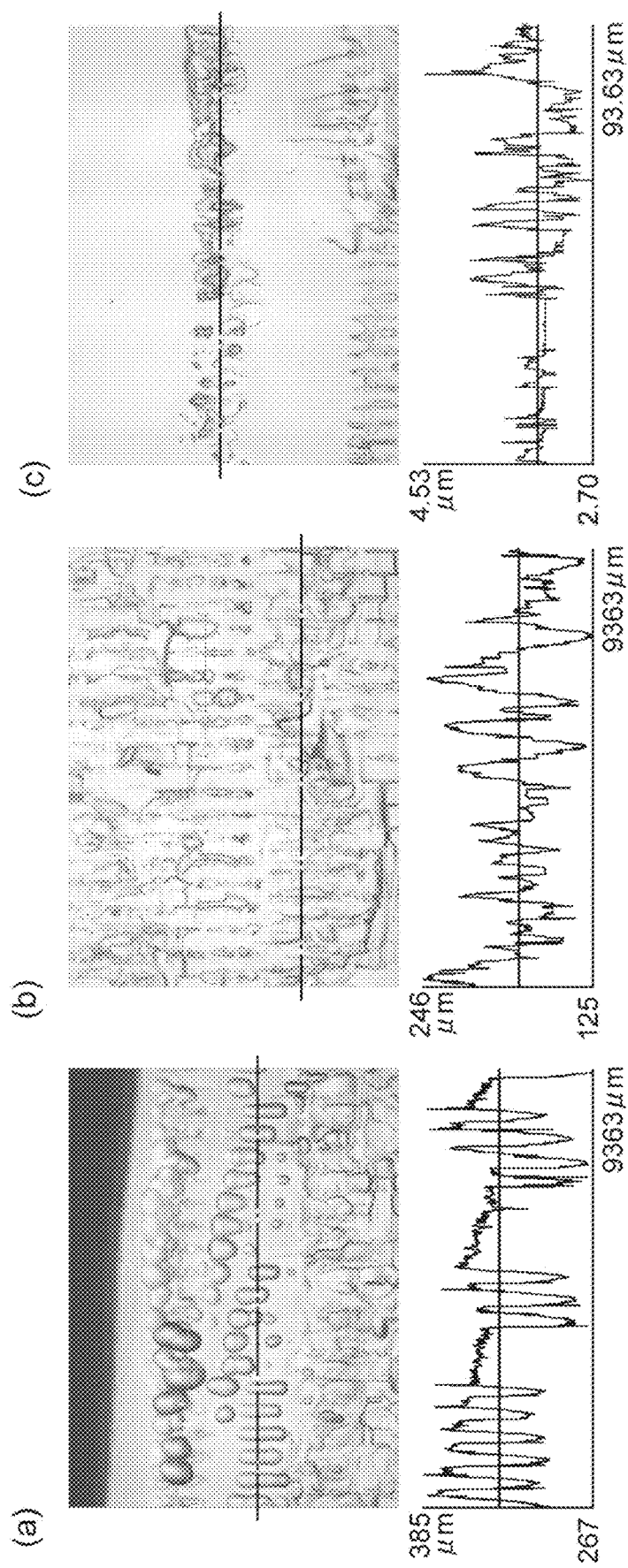
FIG. 27 is a diagram illustrating the object cutting method according to the one embodiment.
Figure 29:
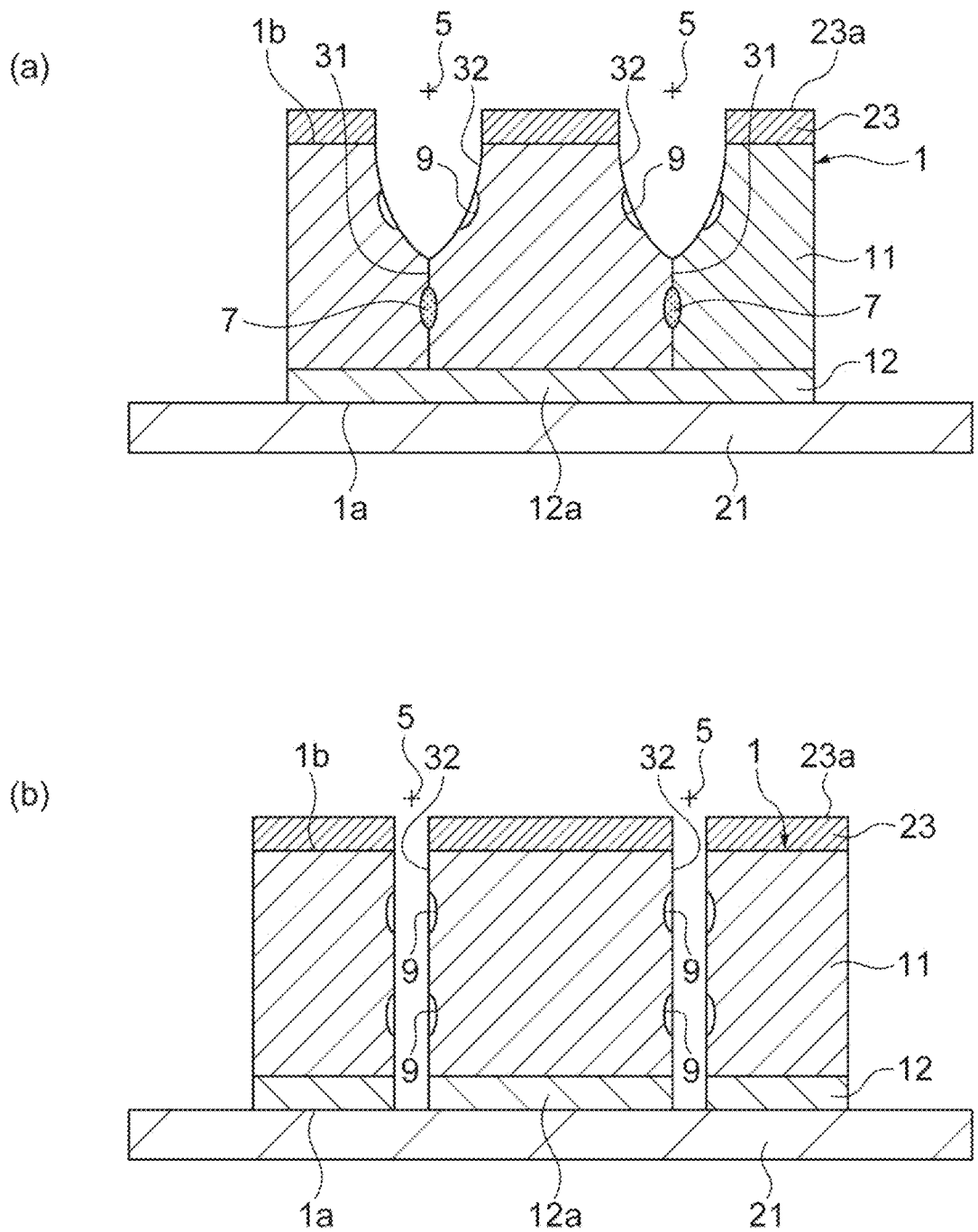
FIG. 29 is a sectional view illustrating the object cutting method according to the one embodiment.
Figure 31:
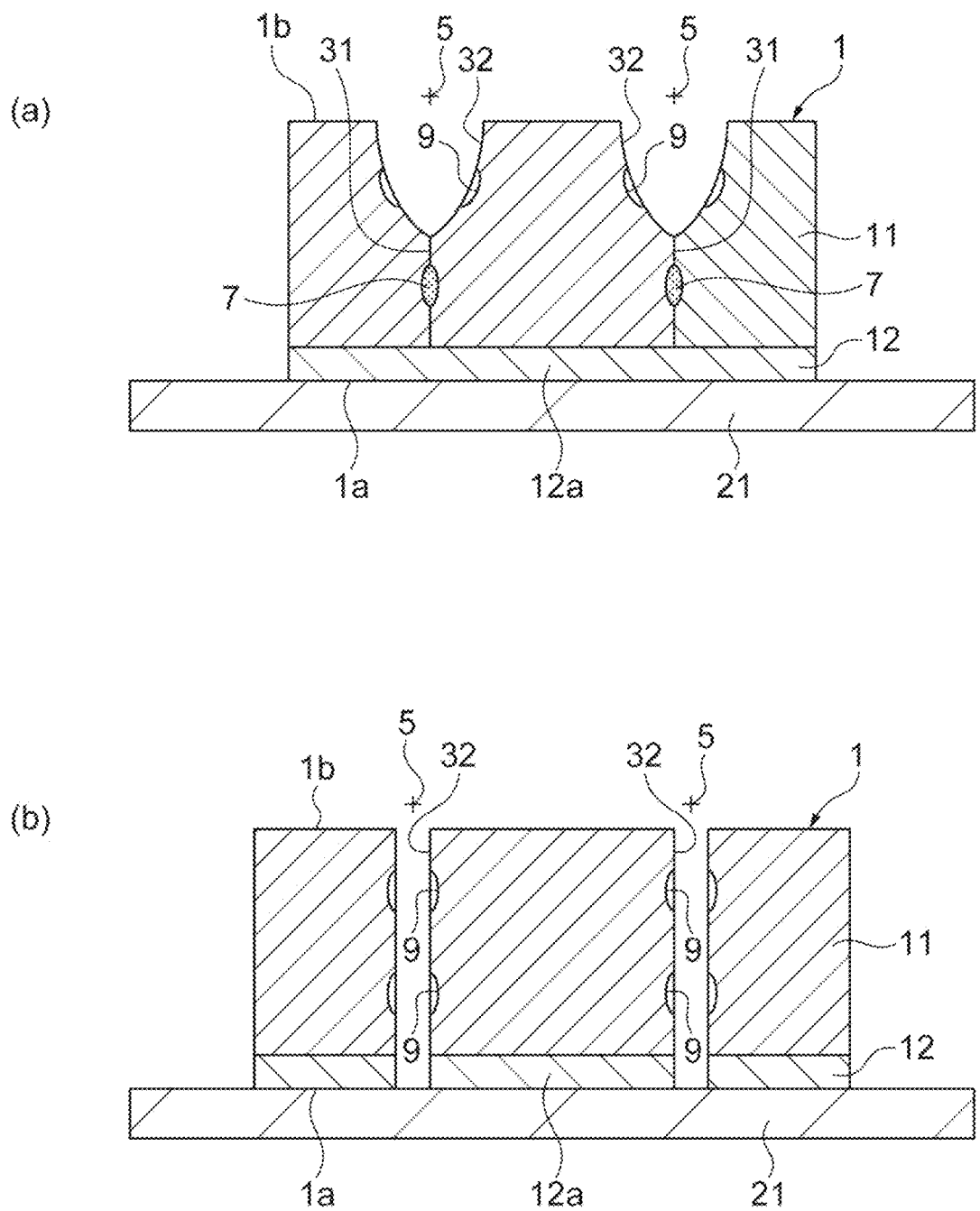
FIG. 31 is a sectional view illustrating the object cutting method according to the one embodiment.

In FIG. 27(a), an upper part is a picture of the uneven region 9, and a lower part is an uneven profile of the uneven region 9 along a one-dot chain line at the upper part. In FIG. 27(b), an upper part is a picture of the modified region 7, and a lower part is an uneven profile of the modified region 7 along a one-dot chain line at the upper part. Comparing the drawings, it is understood that there is a tendency in which only a plurality of relatively large recessed portions is formed in the uneven region 9, but there is a tendency in which a plurality of relatively large protrusion portions and the plurality of relatively large recessed portions are randomly formed in the modified region 7. FIG. 27(c) is a picture and an uneven profile of "the modified region 7 on the second main surface 1b side" in a case where the object 1 has been cut without performing dry etching on the object 1 from the second main surface 1b side. In the modified region 7 in this case, there is also a tendency in which a plurality of relatively large protrusion portions is randomly formed in addition to the plurality of relatively large recessed portions. That is, it is understood that a tendency in which only a plurality of relatively large recessed portions is formed in the uneven region 9 is caused by removing the modified region 7 by dry etching.

As described above, according to the one embodiment, the object cutting method includes the first step of preparing the object 1 including the single crystal silicon substrate 11 and the functional device layer 12 provided on the first main surface 1a side, the second step of irradiating the object 1 with laser light L to form at least one row of modified regions 7 in the single crystal silicon substrate 11 along each of the plurality of lines 5 to cut and to form the fracture 31 in the object 1 so as to extend between the at least one row of modified regions 7 and the second main surface 1b of the object 1 along each of the plurality of lines 5 to cut, and the fourth step of, after the second step, performing dry etching on the object 1 from the second main surface 1b side to form the groove 32 opening to the second main surface 1b, in the object 1 along each of the plurality of lines 5 to cut.

In the object cutting method, the dry etching is performed from the second main surface 1b side, on the object 1 in which the fracture 31 is formed to extend between the at least one row of modified regions 7 and the second main surface 1b of the object 1. Thus, the dry etching selectively progresses from the second main surface 1b along the fracture 31, and the groove 32 in which an opening is narrow in width and deep is formed along each of the plurality of lines 5 to cut. Thus, it is possible to reliably cut the object 1 into the plurality of semiconductor chips 15 along each of the lines 5 to cut, by extending the extension film 22 stuck to the second main surface 1b side to which the groove 32 opens, for example.

In the fourth step, dry etching is performed from the second main surface 1b such that the at least one row of modified regions 7 is removed, and the uneven region which has an uneven shape corresponding to the removed modified region 7 and in which single crystal silicon is exposed is formed in the inner surface of the groove 32. Thus, since the uneven region 9 in which single crystal silicon is exposed is formed, it is possible to suppress a decrease of strength in the vicinity of the uneven region 9.

After the second step, as the third step, the etching protection layer 23 in which the gas passage region (Here, fracture 31) is formed along each of the plurality of lines to cut is formed on the second main surface 1b, in the fourth step, dry etching is performed with $XeF_2$ from the second main surface 1b, in a state where the etching protection layer 23 in which the gas passage region is formed along each of the plurality of lines to cut is formed on the second main surface 1b. Accordingly, it is possible to cause dry etching to selectively progress with higher efficiency and to form the groove 32 having an opening which is narrow in width and is deep, with higher efficiency.

In particular, in a case where the fracture 31 is formed in the etching protection layer 23 to continue to the fracture 31 formed in the object 1, it is possible to save labor, for example, for forming a slit in the etching protection layer 23 by performing patterning on the etching protection layer 23.

In the fourth step, dry etching is performed from the second main surface 1b side such that the etching protection layer 23 remains. Thus, it is possible to cause the etching protection layer 23 to function as a strong reinforcing layer or a gettering layer for capturing impurities, in the semiconductor chip 15. In a case where the etching protection layer 23 is made of metal, it is possible to cause the etching protection layer 23 to function as an electrode layer in the semiconductor chip 15. Further, it is possible to maintain the original thickness of the single crystal silicon substrate 11, in the semiconductor chip 15. In the fourth step, dry etching may be performed from the second main surface 1b side to remove the etching protection layer 23. According to this configuration, it is possible to prevent an occurrence of an unnecessary influence by the etching protection layer 23, in the semiconductor chip 15.

In the second step, since the plurality of rows of modified regions 7 arranged in the thickness direction of the object 1 is formed, at least one row of modified regions 7 is formed along each of the plurality of lines 5 to cut, and the fracture 31 is formed to extend between the modified regions 7 adjacent to each other among the plurality of rows of modified regions 7. Thus, it is possible to cause dry etching to selectively progress deeper. In this case, in the third step, dry etching is performed from the second main surface 1b side such that modified regions 7 on the second main surface 1b side among the plurality of rows of modified regions 7 are removed, and thereby the uneven region 9 having an uneven shape corresponding to the removed modified region 7 is formed in the inner surface of the groove 32.

In the second step, the at least one row of modified regions 7 may be formed along each of the plurality of lines 5 to cut by forming the plurality of modified spots 7a arranged along each of the plurality of lines 5 to cut, and the fracture 31 may be formed to extend between modified spots 7a adjacent to each other among the plurality of rows of modified spots 7a. Thus, it is possible to cause the dry etching to selectively progress with higher efficiency.

In the fifth step, the object 1 is cut into the plurality of semiconductor chips 15 along each of the plurality of lines 5 to cut by sticking the extension film 22 to the second main surface 1b side and extending the extension film 22. Thus, it is possible to reliably cut the object 1 into the plurality of semiconductor chips 15 along each of the lines 5 to cut. Further, since the plurality of semiconductor chips 15 is spaced from each other on the extension film 22, it is possible to easily pick the semiconductor chips 15 up.

The semiconductor chip 15 includes the single crystal silicon substrate 110 and the functional device layer 120 provided on the first surface 110a side of the single crystal silicon substrate 110. The second portion 112 on at least the second surface 110b side in the single crystal silicon substrate 110 has a shape which becomes thinner as becoming farther from the first surface 110a. The uneven region 9 which has an uneven shape and in which single crystal silicon is exposed is formed in the side surface 112a of the second portion 112 to have a band shape.

In the semiconductor chip 15, it is possible to cause the uneven region 9 to function as a gettering region of capturing impurities. Since single crystal silicon is exposed in the uneven region 9, it is possible to suppress the decrease of strength in the vicinity of the uneven region 9.

For example, a pressure-sensitive tape having vacuum resistance, a UV tape, or the like can be used as the protective film 21. Instead of the protective film 21, a wafer fixing jig having etching resistance may be used.

It is not necessary that the material of the etching protection layer 23 is a material having transparency to laser light L. As the etching protection layer 23, the embodiment is not limited to forming of a $SiO_2$ film on the second main surface 1b of the object 1, for example. For example, a resist film or a resin film may be formed on the second main surface 1b of the object 1 by spin coating, or a metal film (Au film, Al film, or the like) may be formed on the second main surface 1b of the object 1 by sputtering. If the etching protection layer 23 is formed on the second main surface 1b of the object 1 by the above methods, a fracture 31 is formed in the etching protection layer 23 to continue to the fracture 31 formed in the single crystal silicon substrate 11, and the fracture 31 reaches the surface 23a of the etching protection layer 23. That is, the fracture 31 is formed in the etching protection layer 23 without burying the fracture 31 formed in the single crystal silicon substrate 11 with the material of the etching protection layer 23. At this time, even though the material of the etching protection layer 23 enters into the fracture 31 formed in the single crystal silicon substrate 11, a practical problem in the subsequent steps does not occur so long as the fracture 31 formed in the single crystal silicon substrate 11 is not buried with the material of the etching protection layer 23.

The gas passage region formed in the etching protection layer 23 along each of the plurality of lines 5 to cut is not limited to the fracture 31. As the gas passage region, for example, a slit for exposing the second main surface 1b of the object 1 may be formed by performing patterning on the etching protection layer 23, or a modified region (region including multiple microcracks, ablation region, and the like) may be formed by performing irradiation with laser light L.

The number of rows of modified regions 7 formed in the single crystal silicon substrate 11 along each of the plurality of lines 5 to cut is not limited to a plurality of rows and may be one row. That is, at least one row of modified regions 7 may be formed in the single crystal silicon substrate 11 along each of the plurality of lines 5 to cut. In a case where a plurality of rows of modified regions 7 is formed in the single crystal silicon substrate 11 along each of the plurality of lines 5 to cut, the modified regions 7 adjacent to each other may be connected to each other.

The fracture 31 may be formed to extend between at least one row of modified regions 7 and the second main surface 1b of the object 1. That is, the fracture 31 may not reach the second main surface 1b if the fracture is partial. Further, if the fracture 31 is partial, the fracture 31 may not extend between the modified regions 7 adjacent to each other and may not extend between the modified spots 7a adjacent to each other. The fracture 31 may or may not reach the first main surface 1a of the object 1.

Dry etching may be performed from the second main surface 1b side to remove the etching protection layer 23. Dry etching may be performed from the second main surface 1b side such that the plurality of rows of modified regions 7 is removed, and thereby the uneven region 9 which has an uneven shape corresponding to the plurality of rows of removed modified regions 7 and in which single crystal silicon is exposed is formed in the inner surface of the groove 32. The type of dry etching is not limited to reactive gas etching with $XeF_2$. As dry etching, for example, reactive ion etching with $CF_4$ or reactive ion etching with $SF_6$ may be performed.

In a case where the plurality of rows of modified regions 7 is formed in the single crystal silicon substrate 11 along each of the plurality of lines 5 to cut, dry etching may be performed, as illustrated in FIG. 28(a), such that the etching protection layer 23 remains, and some modified regions 7 are removed. Alternatively, dry etching may be performed such that the etching protection layer 23 remains, and all the modified regions 7 are removed, as illustrated in FIG. 28(b). Alternatively, dry etching may be performed such that the etching protection layer 23 remains, and the object 1 is completely divided, as illustrated in FIG. 28(c).

In a case where the plurality of rows of modified regions 7 is formed in the single crystal silicon substrate 11 along each of the plurality of lines 5 to cut, dry etching may be performed, as illustrated in FIG. 29(a), such that the etching protection layer 23 remains, and the sectional shape of the groove 32 has a U-shape. Alternatively, dry etching may be performed such that the etching protection layer 23 remains, and the sectional shape of the groove 32 has an I-shape, as illustrated in FIG. 29(b).

In a case where the plurality of rows of modified regions 7 is formed in the single crystal silicon substrate 11 along each of the plurality of lines 5 to cut, dry etching may be performed, as illustrated in FIG. 30(a), such that the etching protection layer 23 is removed, and some modified regions 7 are removed. Alternatively, dry etching may be performed such that the etching protection layer 23 is removed, and all the modified regions 7 are removed, as illustrated in FIG. 30(b). Alternatively, dry etching may be performed such that the etching protection layer 23 is removed, and the object 1 is completely divided, as illustrated in FIG. 30(c).

In a case where the plurality of rows of modified regions 7 is formed in the single crystal silicon substrate 11 along each of the plurality of lines 5 to cut, dry etching may be performed, as illustrated in FIG. 31(a), such that the etching protection layer 23 is removed, and the sectional shape of the groove 32 has a U-shape. Alternatively, dry etching may be performed such that the etching protection layer 23 is removed, and the sectional shape of the groove 32 has an I-shape, as illustrated in FIG. 31(b).

In a case where dry etching is performed such that the object 1 is completely divided (see FIGS. 28(c), 29(b), 30(c), and 31(b)), it is not necessary that the extension film 22 is extended. However, in order to easily pick the semiconductor chip 15 up, the extension film 22 may be extended, and thus the plurality of semiconductor chips 15 on the extension film 22 may be spaced from each other.

Figure 32:
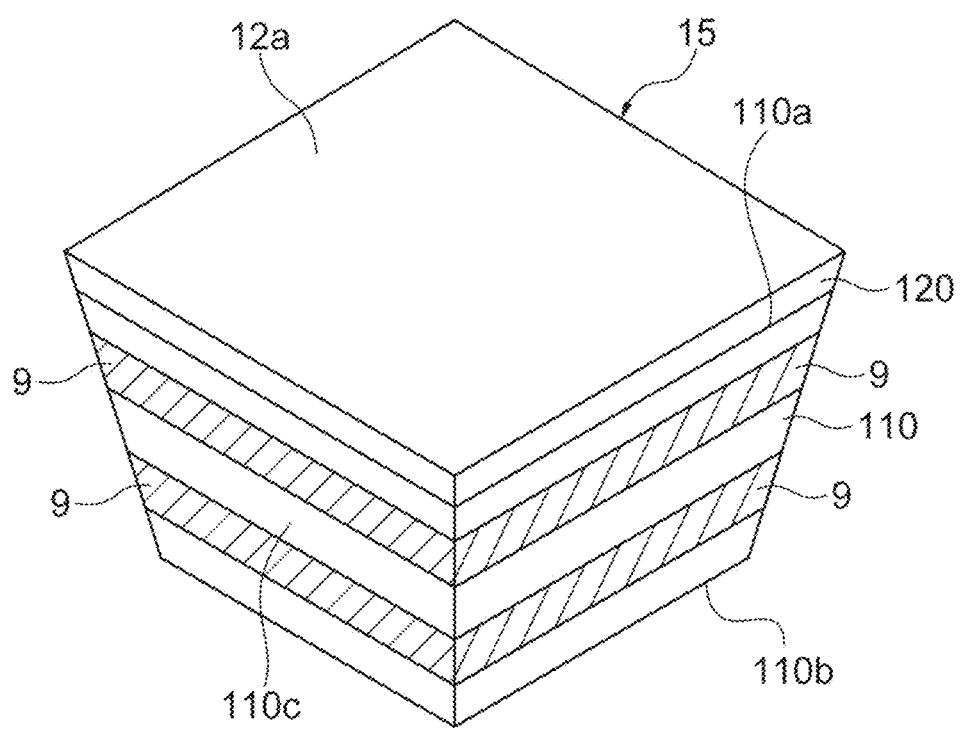
FIG. 32 is a perspective view of the semiconductor chip illustrating the object cutting method according to the one embodiment.

In the semiconductor chip 15, as illustrated in FIG. 32, at least one row of uneven regions 9 may be formed to have a band shape in the side surface 110c of the single crystal silicon substrate 110, without the modified region 7 remaining. The uneven region 9 is formed by removing all of the modified regions 7 formed in the single crystal silicon substrate 11 of the object 1 by dry etching (see FIGS. 30(b) and 30(c)). Such a semiconductor chip 15 is obtained, for example, in a case where dry etching is performed from the second main surface 1b to completely divide the object 1. In the semiconductor chip 15 illustrated in FIG. 32, the entirety of the single crystal silicon substrate 110 has a shape which becomes thinner as becoming farther from the first surface 110a. That is, the entirety of the side surface 110c of the single crystal silicon substrate 110 corresponds to the inner surface of the groove 32 formed in the single crystal silicon substrate 11 of the object 1 (see FIGS. 30(b) and 30(c)). As an example, the entirety of the single crystal silicon substrate 110 has a quadrangular pyramid shape which becomes thinner as becoming farther from the first surface 110a. The semiconductor chip 15 illustrated in FIG. 32 may include the etching protection layer 230 formed on the second surface 110b of the single crystal silicon substrate 110.

A second step as follows may be performed instead of the above-described second step. That is, as a second step, as illustrated in FIG. 33(a), the object 1 is irradiated with laser light L by using a first main surface 1a as a laser light entrance surface, and thereby at least one row of modified regions 7 is formed in the single crystal silicon substrate 11 along each of a plurality of lines 5 to cut, and a fracture 31 is formed in the object 1 along each of the plurality of lines 5 to cut, so as to extend between the at least one row of modified regions 7 and the second main surface 1b of the object 1. As illustrated in FIG. 33(b), another protective film 21 is stuck to the first main surface 1a, and the protective film 21 which has been previously stuck is removed from the second main surface 1b. The subsequent steps are similar to the steps subsequent to the third step described above.

Figure 34:
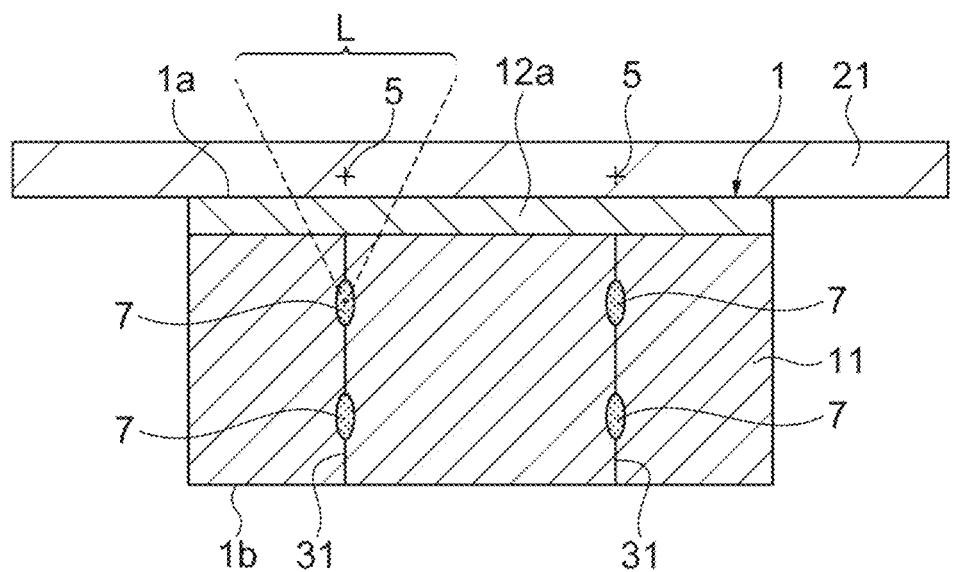
FIG. 34 is a sectional view illustrating the object cutting method according to the one embodiment.
Figure 40:
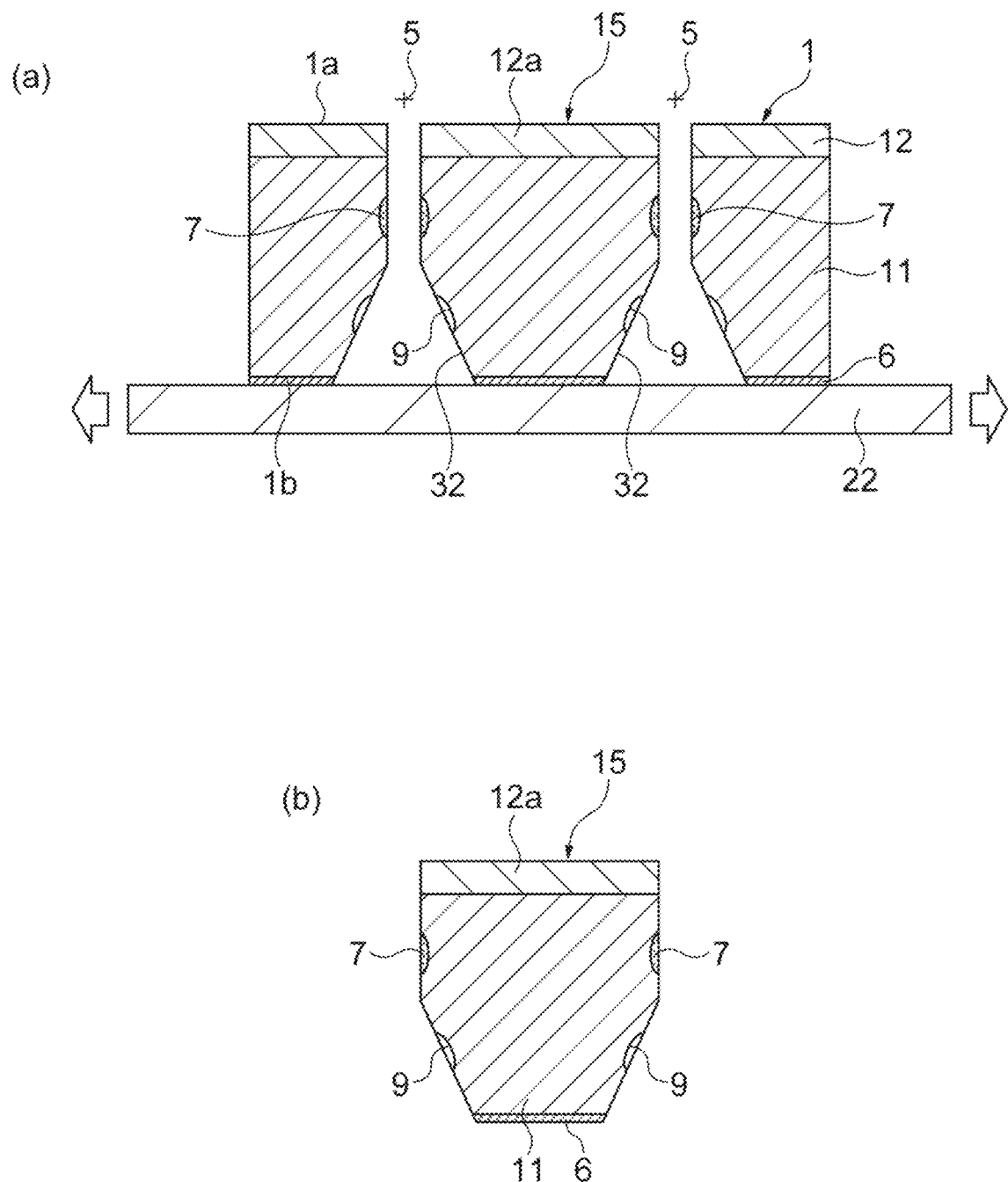
FIG. 40 is a sectional view illustrating the object cutting method according to the one embodiment.

In a case where the material of the protective film 21 stuck to the first main surface 1a of the object 1 is a material having transparency to laser light L, the object 1 may be irradiated with the laser light L through the protective film 21, as illustrated in FIG. 34.

An object cutting method as follows can be performed. With the object cutting method as follows, it is also possible to reliably cut the object 1 into a plurality of semiconductor chips 15.

Firstly, as a first step, as illustrated in FIG. 35(a), an object to be processed 1 including a single crystal silicon substrate 11 and a functional device layer 12 provided on a first main surface 1a side is prepared, and a protective film 21 is stuck to a second main surface 1b of the object 1.

After the first step, as a second step, the object 1 is irradiated with laser light L by using a first main surface 1a as a laser light entrance surface, and thereby at least one row of modified regions 7 is formed in the single crystal silicon substrate 11 along each of a plurality of lines 5 to cut, and a fracture 31 is formed in the object 1 along each of the plurality of lines 5 to cut, so as to extend between the at least one row of modified regions 7 and the first main surface 1a.

After the second step, as a third step, as illustrated in FIG. 35(b), an etching protection layer 23 in which the fracture 31 is formed along each of the plurality of lines 5 to cut is formed on the first main surface 1a of the object 1. If the etching protection layer 23 made of $SiO_2$ is formed on the first main surface 1a of the object 1 by vapor deposition, for example, a fracture 31 is formed in the etching protection layer 23 to continue to the fracture 31 formed in the object 1, and the fracture 31 reaches a surface 23a (outer surface on an opposite side of the single crystal silicon substrate 11) of the etching protection layer 23. Here, the fracture 31 formed in the etching protection layer 23 along each of the plurality of lines 5 to cut functions as a gas passage region in the etching protection layer 23.

After the third step, as a fourth step, as illustrated in FIG. 36(a), dry etching is performed on the object 1 from the first main surface 1a side in a state where the etching protection layer 23 is formed on the first main surface 1a, and thereby a groove 32 is formed in the object 1 along each of the plurality of lines 5 to cut, as illustrated in FIG. 36(b). The groove 32 is, for example, a V groove (groove having a V-shaped section) opening to the first main surface 1a. Here, dry etching is performed on the object 1 from the first main surface 1a side such that the etching protection layer 23 remains. However, dry etching may be performed on the object 1 from the first main surface 1a side to remove the etching protection layer 23.

Performing dry etching on the object 1 from the first main surface 1a side has the meaning that dry etching is performed on the single crystal silicon substrate 11 in a state where the second main surface 1b is covered with the protective film and the like, and the first main surface 1a (or etching protection layer 23 in which a gas passage region is formed along each of the plurality of lines 5 to cut) is exposed to an etching gas. In particular, in a case of performing reactive ion etching (plasma etching), performing dry etching means irradiation of the first main surface 1a (or etching protection layer 23 in which the gas passage region is formed along each of the plurality of lines 5 to cut) with reactive species in plasma.

After the fourth step, as a fifth step, as illustrated in FIG. 37(a), the object 1 is cut into a plurality of semiconductor chips 15 along each of the plurality of lines 5 to cut by extending the protective film 21 stuck to the second main surface 1b of the object 1, as the extension film 22. Then, as illustrated in FIG. 37(b), the semiconductor chips 15 are picked up.

An object cutting method as follows can be performed. With the object cutting method as follows, it is also possible to reliably cut the object 1 into a plurality of semiconductor chips 15.

A first step and a second step are similar to the steps illustrated in FIGS. 7(a) and 7(b). That is, as the first step, as illustrated in FIG. 7(a), an object to be processed 1 including a single crystal silicon substrate 11 and a functional device layer 12 provided on a first main surface 1a side is prepared, and a protective film 21 is stuck to a first main surface 1a of the object 1.

After the first step, as the second step, as illustrated in FIG. 7(b), the object 1 is irradiated with laser light L by using a second main surface 1b as a laser light entrance surface, and thereby a plurality of rows of modified regions 7 is farmed in the single crystal silicon substrate 11 along each of a plurality of lines 5 to cut, and a fracture 31 is formed in the object 1 along each of the plurality of lines 5 to cut. A plurality of rows of modified regions 7 formed along each of the plurality of lines 5 to cut is arranged in the thickness direction of the object 1. Each of the plurality of rows of modified regions 7 is constituted by a plurality of modified spots 7a arranged along the line 5 to cut (see FIG. 21). The fracture 31 extends between one row of modified regions 7 on the second main surface 1b side and the second main surface 1b, and between the modified regions 7 adjacent to each other among the plurality of rows of modified regions 7. Further, the fracture 31 extends between the modified spots 7a adjacent to each other among the plurality of modified spots 7a (see FIG. 21).

After the second step, as a third step, as illustrated in FIG. 38(a), the black silicon layer 6 in which the fracture 31 is formed along each of the plurality of lines 5 to cut is formed on the second main surface 1b of the object 1, as the etching protection layer. Here, the black silicon layer 6 is formed on the second main surface 1b of the object 1 by increasing an introduction amount of oxygen ($O_2$) into the etching gas ($CF_4$, $SF_6$, or the like) for reactive ion etching. In this case, a fracture 31 is formed in the black silicon layer 6 to continue to the fracture 31 formed in the object 1, and the fracture 31 reaches the surface (outer surface on an opposite side of the single crystal silicon substrate 11) of the black silicon layer 6. Here, the fracture 31 formed in the black silicon layer 6 along each of the plurality of lines 5 to cut functions as a gas passage region in the black silicon layer 6.

After the third step, as the fourth step, as illustrated in FIG. 3855(b), only the introduction amount of $O_2$ is reduced, dry etching is performed on the object 1 from the second main surface 1b side in a state where the black silicon layer 6 is formed on the second main surface 1b, and thereby a groove 32 is formed in the object 1 along each of the plurality of lines 5 to cut, as illustrated in FIG. 38(c). The groove 32 is, for example, a V groove (groove having a V-shaped section) opening to the second main surface 1b. Here, dry etching is performed on the object 1 from the second main surface 1b side by the etching gas for reactive ion etching.

After the fourth step, as a fifth step, as illustrated in FIG. 39(a), an extension film 22 is stuck to the black silicon layer 6 on the second main surface 1b of the object 1 (that is, stuck to the second main surface 1b side of the object 1), and, as illustrated in FIG. 39(b), the protective film 21 is removed from the first main surface 1a of the object 1. As illustrated in FIG. 40(a), the object 1 is cut into a plurality of semiconductor chips 15 along each of the plurality of lines 5 to cut, by extending the extension film 22. Then, as illustrated in FIG. 40(b), the semiconductor chips 15 are picked up.

REFERENCE SIGNS LIST

1 . . . object to be processed, 1a . . . first main surface, 1b . . . second main surface, 5 . . . line to cut, 7 . . . modified region, 7a . . . modified spot, 11 . . . single crystal silicon substrate, 12 . . . functional device layer, 15 . . .

semiconductor chip, 22 . . . extension film, 23 . . . etching protection layer, 23a . . . surface, 31 . . . fracture, 32 . . . groove, L . . . laser light

The invention claimed is:

1. An object cutting method, comprising:
a first step of providing an object to be processed including a single crystal silicon substrate and a functional device layer provided on a first main surface side;
a second step of, after the first step, irradiating the object with laser light to form at least one row of modified regions in the single crystal silicon substrate along each of a plurality of lines to cut and to form a first portion of a fracture in the object so as to extend between the at least one row of modified regions and a second main surface of the object along each of the plurality of lines to cut;
a third step of, after the second step, forming an etching protection layer on the second main surface by a process of vapor deposition, spin coating, or sputtering, such that the forming of the etching protection layer by the process forms a second portion of the fracture in the etching protection layer along each of the plurality of lines to cut, wherein the second portion of the fracture formed in the etching protection layer continues to the first portion of the fracture formed in the object and reaches a surface of the etching protection layer; and
a fourth step of, after the third step, performing dry etching on the object from the second main surface side, in a state in which the etching protection layer is formed on the second main surface, to form a groove opening to the second main surface, in the object along each of the plurality of lines to cut,
wherein, in the fourth step, the second portion of the fracture formed in the third step in the etching protection layer along each of the plurality of lines to cut functions as a gas passage region in the etching protection layer.

2. The object cutting method according to claim 1, wherein, in the fourth step, the dry etching is performed from the second main surface side so that the etching protection layer remains.

3. The object cutting method according to claim 1, wherein, in the fourth step, the dry etching is performed from the second main surface side so that the etching protection layer is removed.

4. The object cutting method according to claim 1, wherein, in the second step, the at least one row of modified regions is formed along each of the plurality of lines to cut by forming a plurality of rows of modified regions arranged in a thickness direction of the object, and the first portion of the fracture is formed to extend between modified regions adjacent to each other among the plurality of rows of modified regions.

5. The object cutting method according to claim 1, wherein, in the second step, the at least one row of modified regions is formed along each of the plurality of lines to cut by forming a plurality of modified spots arranged along each of the plurality of lines to cut, and the first portion of the fracture is formed to extend between modified spots adjacent to each other among the plurality of modified spots.

6. The object cutting method according to claim 1, further comprising:
a fifth step of, after the fourth step, cutting the object into a plurality of semiconductor chips along each of the plurality of lines to cut by sticking a film to the second main surface side and expanding the film.

7. The object cutting method according to claim 1, wherein the second portion of the fracture is formed in the etching protection layer during the process of vapor deposition, spin coating, or sputtering to form the etching protection layer on the second main surface, and extends from the first portion of the fracture in a thickness direction to the surface of the etching protection layer.

8. An object cutting method, comprising:
a first step of providing an object to be processed including a single crystal silicon substrate and a functional device layer provided on a first main surface side;
a second step of, after the first step, irradiating the object with laser light to form at least one row of modified regions in the single crystal silicon substrate along each of a plurality of lines to cut and to form a first portion of a fracture in the object so as to extend between the at least one row of modified regions and the first main surface along each of the plurality of lines to cut;
a third step of, after the second step, forming an etching protection layer on the first main surface by a process of vapor deposition, spin coating, or sputtering, such that the forming of the etching protection layer by the process forms a second portion of the fracture in the etching protection layer along each of the plurality of lines to cut, wherein the second portion of the fracture formed in the etching protection layer continues to the first portion of the fracture formed in the object and reaches a surface of the etching protection layer; and
a fourth step of, after the third step, performing dry etching on the object from the first main surface side, in a state in which the etching protection layer is formed on the first main surface, to form a groove opening to the first main surface, in the object along each of the plurality of lines to cut,
wherein, in the fourth step, the second portion of the fracture formed in the third step in the etching protection layer along each of the plurality of lines to cut functions as a gas passage region in the etching protection layer.

9. The object cutting method according to claim 8, wherein the second portion of the fracture is formed in the etching protection layer during the process of vapor deposition, spin coating, or sputtering to form the etching protection layer on the first main surface, and extends from the first portion of the fracture in a thickness direction to the surface of the etching protection layer.

* * * * *